US011106209B2

(12) United States Patent
Ucar et al.

(10) Patent No.: US 11,106,209 B2
(45) Date of Patent: Aug. 31, 2021

(54) ANOMALY MAPPING BY VEHICULAR MICRO CLOUDS

(71) Applicant: TOYOTA JIDOSHA KABUSHIKI KAISHA, Toyota (JP)

(72) Inventors: Seyhan Ucar, Mountain View, CA (US); Takamasa Higuchi, Mountain View, CA (US); Baik Hoh, Mountain View, CA (US); Onur Altintas, Mountain View, CA (US); Kentaro Oguchi, Mountain View, CA (US); Toru Nakanishi, Nagakute (JP)

(*) Notice: Subject to any disclaimer, the term of this patent is extended or adjusted under 35 U.S.C. 154(b) by 252 days.

(21) Appl. No.: 16/273,134

(22) Filed: Feb. 11, 2019

(65) Prior Publication Data
US 2020/0257298 A1    Aug. 13, 2020

(51) Int. Cl.
G05D 1/02      (2020.01)
H04W 4/46      (2018.01)
H04W 4/44      (2018.01)
G06F 16/901    (2019.01)
G06F 30/20     (2020.01)

(52) U.S. Cl.
CPC ....... *G05D 1/0214* (2013.01); *G06F 16/9024* (2019.01); *G06F 30/20* (2020.01); *H04W 4/44* (2018.02); *H04W 4/46* (2018.02)

(58) Field of Classification Search
CPC ........ G05D 1/0214; H04W 4/46; H04W 4/44; H04W 4/021; G06F 16/9024; G06F 30/20
USPC .......................................................... 701/26
See application file for complete search history.

(56) References Cited

U.S. PATENT DOCUMENTS

| 10,222,228 | B1* | 3/2019 | Chan ................. G01C 21/3691 |
| 2016/0277911 | A1 | 9/2016 | Kang et al. |
| 2019/0179336 | A1* | 6/2019 | Colijn ..................... G08G 1/14 |
| 2020/0169605 | A1* | 5/2020 | Higuchi ............. H04L 67/1095 |

FOREIGN PATENT DOCUMENTS

WO        2014011556       1/2014
WO    WO-2014011556 A1 *  1/2014

OTHER PUBLICATIONS

EPO, Extended European Search Report for European Patent Application No. 20155298.1, dated May 11, 2020, 10 pages.
EPO, Communication Pursuant to Article 94(3) EPC for European Patent Application No. 20155298.1, dated Jun. 15, 2021, 8 pages.

* cited by examiner

*Primary Examiner* — Muhammad Shafi
(74) *Attorney, Agent, or Firm* — Burbage Law, P.C.; Jon-Michael Burbage; Elizabeth Ruzich

(57) ABSTRACT

The disclosure includes embodiments for generating improved anomaly maps. In some embodiments, a method for a connected vehicle includes detecting an occurrence of an anomaly in a roadway environment based on sensor data describing the roadway environment. The method includes creating, by the connected vehicle, an anomaly map that describes the anomaly. The method includes modifying an operation of a communication unit of the connected vehicle to receive one or more other anomaly maps describing the anomaly from one or more cooperation endpoints in the roadway environment. The method includes generating an updated anomaly map based on the anomaly map created by the connected vehicle and the one or more other anomaly maps created by the one or more cooperation endpoints so that an accuracy of the updated anomaly map is improved.

20 Claims, 14 Drawing Sheets

ANOMALY MAPPING BY VEHICULAR MICRO CLOUDS

BACKGROUND

The specification relates to using a vehicular micro cloud to improve anomaly-mapping.

Distributed data storage and computing by a cluster of connected vehicles (i.e., a "vehicular micro cloud") is a promising solution to cope with an increasing network traffic generated for and by connected vehicles. Vehicles collaboratively store (or cache) data sets in their onboard data storage devices and compute and share these data sets over vehicle-to-vehicle (V2V) networks as requested by other vehicles. The use of vehicular micro clouds removes the need for connected vehicles to access remote cloud servers or edge servers by vehicle-to-network (V2N) communications (e.g., by cellular networks) whenever they need to get access to computing resources such as shared data (e.g., high-definition road map for automated driving), shared computational power, and cloudification services.

A problem is that vehicles currently use their onboard sensors to detect anomalies and create maps of these anomalies that describe where the detected anomalies occur in their environment. However, these maps are not as good as they could be because vehicles only have one perspective. Traditional Vehicle-to-Everything (V2X) communication may be used to solve this problem, but problems such as latency, communication overhead, and underdeveloped infrastructure prevent V2X communication from being a suitable solution.

SUMMARY

Described are embodiments of an anomaly client installed in a roadside edge server or a cloud server and an anomaly detector installed in an onboard unit of a connected vehicle. The anomaly client and the anomaly detector cooperate with one another to use a vehicular micro cloud to improve an anomaly-map generation technique that can generate improved anomaly maps.

In some embodiments, the anomaly client and the anomaly detector cooperate with one another to provide a solution that uses vehicular micro clouds to generate better anomaly maps. The embodiments described herein output digital data that describes the anomaly maps, and this digital data is provided by the anomaly detector as an input to a vehicle control system (e.g., ADAS systems or autonomous driving systems) of the connected vehicle that includes the anomaly detector. Our research indicates that the anomaly maps generated by the embodiments described herein are operable to assist a vehicle control system (e.g., one or more ADAS systems or an autonomous driving system) of the connected vehicle to function better in roadway environments where anomalies occur when compared to the function or operation of these vehicle control systems when they operate without the benefit of the anomaly maps generated by the embodiments described herein.

In some embodiments, the anomaly detector uses onboard sensors of the connected vehicle to detect an anomaly that occurs in its operating environment, thereby generating anomaly information. The anomaly detector builds an anomaly map that describes a location of the anomaly. Based on the detected anomaly, the anomaly detector transmits a V2X wireless message to the anomaly client with instructions that, depending on the characteristics of the anomaly observed, a vehicular micro cloud needs to be formed at one of: (1) a geographic location of the anomaly (i.e., a stationary vehicular micro cloud); (2) a current geographic location of the connected vehicle (i.e., a stationary vehicular micro cloud); (3) at a current geographic location or upcoming consecutive locations of the connected vehicle (i.e., a mobile vehicular micro cloud); or (4) at a current geographic location or upcoming consecutive locations of the anomaly (i.e., a mobile vehicular micro cloud that follows a moving anomaly).

In some embodiments, the anomaly client takes actions to cause vehicles nearby the geographic location of the connected vehicle (or the geographic location of the anomaly) to: form a vehicular micro cloud; and generate their own anomaly maps for this geographic location. In this way, the detection of an anomaly by the connected vehicle serves as a basis for the generation of a stationary or mobile vehicular micro cloud. Accordingly, in some embodiments detection of an anomaly triggers the generation of a vehicular micro cloud.

In some embodiments, the anomaly detector includes code and routines (e.g., a vehicle cloud manager) that are operable to cause vehicles that are members of the vehicular micro cloud to share their anomaly maps with one another via the vehicular micro cloud. An anomaly map generated by the connected vehicle is updated by the anomaly detector of the connected vehicle based on this shared information so that an updated anomaly map is generated.

In some embodiments, a matching sub-routine is executed by the anomaly detector so that it only cooperates on generating the anomaly map (or the updated anomaly map) with certain vehicles whose locations or sensor assets make them best able to generate the best possible anomaly map (e.g., these vehicles may be examples of "cooperation endpoints" described below). The anomaly detector may include rules or other routines that coordinate sensors, resources or a combination thereof of the cooperation endpoints to focus on the anomaly and to govern this process.

If the anomaly detector determines that the updated anomaly map satisfies a simulation criterion (e.g., the updated anomaly map includes sufficient information for running a simulation for the anomaly), then the anomaly detector performs a simulation (or an emulation) to predict a future behavior or an impact of the anomaly, and this information is added to the updated anomaly map. In this way, the anomaly detectors of multiple vehicles may share these updated anomaly maps among one another to arrive at a consensus decision about the future behavior or impact of the anomaly, and the updated anomaly maps may be further modified with this consensus decision. The anomaly detectors of the multiple vehicles upload their updated anomaly maps to the anomaly client via a wireless network where they can be further improved and distributed.

An example advantage and improvement provided by the anomaly-map generation technique described herein include that the anomaly detector and the anomaly client cooperate with one another to use a vehicular micro cloud to improve an anomaly map that is generated by the connected vehicle. Another example advantage provided by the anomaly-map generation technique includes that the anomaly detector and the anomaly client use the vehicular micro cloud to gather enough information to run a simulation (or an emulation) that predicts an impact of the anomaly on a driving environment. If more information is needed, then the anomaly detector governs a process to coordinate sensors, resources or a combination thereof of other vehicles to focus on the anomaly observed. Yet another example advantage provided by the anomaly-map generation technique includes that the anomaly detector uses the vehicular micro cloud to arrive at a consensus decision about the anomaly and its impact on an environment that includes multiple vehicles. Still yet another example advantage provided by the anomaly-map generation technique includes that the anomaly detector and the anomaly client cooperate with one another to generate a vehicular micro cloud (stationary or mobile) based on a trigger event that includes a connected vehicle detecting a presence of an anomaly. Other example advantages of the anomaly detector and the anomaly client are possible.

A system of one or more computers can be configured to perform particular operations or actions by virtue of having software, firmware, hardware, or a combination of them installed on the system that in operation causes the system to perform the actions. One or more computer programs can be configured to perform particular operations or actions by virtue of including instructions that, when executed by data processing apparatus, cause the apparatus to perform the actions.

One general aspect includes a method for a connected vehicle including: detecting an occurrence of an anomaly in a roadway environment based on sensor data describing the roadway environment; creating, by the connected vehicle, an anomaly map that describes the anomaly; modifying an operation of a communication unit of the connected vehicle to receive one or more other anomaly maps describing the anomaly from one or more cooperation endpoints in the roadway environment; and generating an updated anomaly map based on the anomaly map created by the connected vehicle and the one or more other anomaly maps created by the one or more cooperation endpoints so that an accuracy of the updated anomaly map is improved. Other embodiments of this aspect include corresponding computer systems, apparatus, and computer programs recorded on one or more computer storage devices, each configured to perform the actions of the methods.

Implementations may include one or more of the following features. The method further including: responsive to the occurrence of the anomaly, modifying the operation of the communication unit of the connected vehicle to instruct a formation of a vehicular micro cloud; and modifying the operation of the communication unit to share anomaly map information in the vehicular micro cloud so that the one or more other anomaly maps are received from the one or more cooperation endpoints, where each of the one or more cooperation endpoints is a cloud member or a cloud guest of the vehicular micro cloud that cooperates with the connected vehicle to generate the updated anomaly map. The method where responsive to the occurrence of the anomaly, modifying the operation of the communication unit of the connected vehicle to instruct the formation of the vehicular micro cloud includes: generating an instruction to form the vehicular micro cloud responsive to the occurrence of the anomaly; and modifying one or more operation elements of the communication unit to transmit the instruction to a server, where the instruction causes the server to form the vehicular micro cloud that includes the connected vehicle and one or more nearby vehicles approximate to the anomaly as cloud members of the vehicular micro cloud. The method where responsive to the occurrence of the anomaly, modifying the operation of the communication unit of the connected vehicle to instruct the formation of the vehicular micro cloud includes: generating an instruction to form the vehicular micro cloud responsive to the occurrence of the anomaly; and responsive to receiving the instruction at the communication unit, modifying one or more operation elements of the communication unit to communicate with one or more nearby vehicles approximate to the anomaly so that the one or more nearby vehicles are invited by the connected vehicle to join the vehicular micro cloud. The method where modifying the operation of the communication unit to share the anomaly map information in the vehicular micro cloud includes: modifying one or more operation elements of the communication unit to transmit the anomaly map to one or more other cloud members of the vehicular micro cloud; and modifying the one or more operation elements of the communication unit to receive the one or more other anomaly maps from the one or more cooperation endpoints. The method further including: determining whether the updated anomaly map satisfies a simulation criterion; responsive to the updated anomaly map satisfying the simulation criterion, performing a simulation for the anomaly to generate a simulation result based on the updated anomaly map; and modifying the updated anomaly map based on the simulation result. The method where a satisfaction of the simulation criterion by the updated anomaly map includes one or more of: a total number of anomaly maps used to generate the updated anomaly map satisfies a map threshold; a total number of views of the anomaly in the updated anomaly map satisfies a view threshold; a total number of actions of the anomaly in the updated anomaly map satisfies an action threshold; a time window of the actions of the anomaly in the updated anomaly map satisfies a time-window threshold; and a total number of remedy actions reacted against the anomaly satisfies a reaction threshold. The method where the simulation result includes one or more of: a predicted future behavior of the anomaly; an impact of the anomaly on the roadway environment; a simulation of different views of surroundings around the anomaly; a simulation of one or more views of the anomaly in various perspectives; a simulation of one or more actions of the anomaly in various perspectives or in a period of time; and a simulation of one or more remedy actions against the anomaly. The method further including: modifying the operation of the communication unit to share updated anomaly map information in the vehicular micro cloud, including modifying one or more operation elements of the communication unit to send the updated anomaly map to one or more other cloud members of the vehicular micro cloud and modifying the one or more operation elements of the communication unit to receive one or more other updated anomaly maps from the one or more other cloud members of the vehicular micro cloud; arriving at a consensus decision with the one or more other cloud members about the simulation result for the anomaly based on the updated anomaly map and the one or more other updated anomaly maps; modifying the updated anomaly map further based on the consensus decision; and uploading the updated anomaly map to a server using a V2X wireless message. The method further including, responsive to the updated anomaly map not satisfying the simulation criterion: determining one or more additional cooperation endpoints in the roadway environment, and coordinating one or more sensors, one or more computing resources or a combination thereof of each additional cooperation endpoint to focus on the anomaly so that one or more additional anomaly maps are generated by the one or more additional cooperation endpoints; modifying the operation of the communication unit to receive the one or more additional anomaly maps from the one or more additional cooperation endpoints; and generating the updated anomaly map further based on the one or more additional anomaly maps. The method where the vehicular micro cloud is a stationary vehicular micro cloud formed at a location of the anomaly. The method where the vehicular micro cloud is a mobile vehicular micro cloud formed at a current location of the anomaly or upcoming consecutive locations of the anomaly. The method further including: determining the one or more cooperation endpoints based on one or more anomaly mapping policies; and coordinating one or more sensors, one or more computing resources or a combination thereof of each cooperation endpoint to focus on the anomaly so that the one or more other anomaly maps are generated by the one or more cooperation endpoints. The method where the one or more cooperation endpoints are one or more of: an endpoint that is located in a region of interest associated with the anomaly; an endpoint that has been in the region of interest for a period of time that exceeds a time threshold; an endpoint that is expected to remain in the region of interest for a period of time that exceeds the time threshold; and an endpoint with a known trajectory, a known timetable or a combination thereof. The method where the anomaly includes one or more of: a human anomaly in the roadway environment; a data anomaly; a road surface anomaly; and a traffic anomaly. Implementations of the described techniques may include hardware, a method or process, or computer software on a computer-accessible medium.

One general aspect includes a system of a connected vehicle, including a processor and a non-transitory memory storing computer code which, when executed by the processor, causes the processor to: detect an occurrence of an anomaly in a roadway environment based on sensor data describing the roadway environment; create, by the connected vehicle, an anomaly map that describes the anomaly; modify an operation of a communication unit of the connected vehicle to receive one or more other anomaly maps describing the anomaly from one or more cooperation endpoints in the roadway environment; and generate an updated anomaly map based on the anomaly map created by the connected vehicle and the one or more other anomaly maps created by the one or more cooperation endpoints so that an accuracy of the updated anomaly map is improved. Other embodiments of this aspect include corresponding computer systems, apparatus, and computer programs recorded on one or more computer storage devices, each configured to perform the actions of the methods.

Implementations may include one or more of the following features. The system where the computer code, when executed by the processor, causes the processor further to: responsive to the occurrence of the anomaly, modify the operation of the communication unit of the connected vehicle to instruct a formation of a vehicular micro cloud; and modify the operation of the communication unit to share anomaly map information in the vehicular micro cloud so that the one or more other anomaly maps are received from the one or more cooperation endpoints, where each of the one or more cooperation endpoints is a cloud member or a cloud guest of the vehicular micro cloud that cooperates with the connected vehicle to generate the updated anomaly map. The system where the computer code, when executed by the processor, causes the processor further to: determine whether the updated anomaly map satisfies a simulation criterion; responsive to the updated anomaly map satisfying the simulation criterion, perform a simulation for the anomaly to generate a simulation result based on the updated anomaly map; and modify the updated anomaly map based on the simulation result. Implementations of the described techniques may include hardware, a method or process, or computer software on a computer-accessible medium.

One general aspect includes a computer program product including a non-transitory memory storing computer-executable code that, when executed by a processor, causes the processor to: detect an occurrence of an anomaly in a roadway environment based on sensor data describing the roadway environment; create, by a connected vehicle, an anomaly map that describes the anomaly; modify an operation of a communication unit of the connected vehicle to receive one or more other anomaly maps describing the anomaly from one or more cooperation endpoints in the roadway environment; and generate an updated anomaly map based on the anomaly map created by the connected vehicle and the one or more other anomaly maps created by the one or more cooperation endpoints so that an accuracy of the updated anomaly map is improved. Other embodiments of this aspect include corresponding computer systems, apparatus, and computer programs recorded on one or more computer storage devices, each configured to perform the actions of the methods.

Implementations may include one or more of the following features. The computer program product where the computer-executable code, when executed by the processor, causes the processor further to: responsive to the occurrence of the anomaly, modify the operation of the communication unit of the connected vehicle to instruct a formation of a vehicular micro cloud; and modify the operation of the communication unit to share anomaly map information in the vehicular micro cloud so that the one or more other anomaly maps are received from the one or more cooperation endpoints, where each of the one or more cooperation endpoints is a cloud member or a cloud guest of the vehicular micro cloud that cooperates with the connected vehicle to generate the updated anomaly map. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1A:
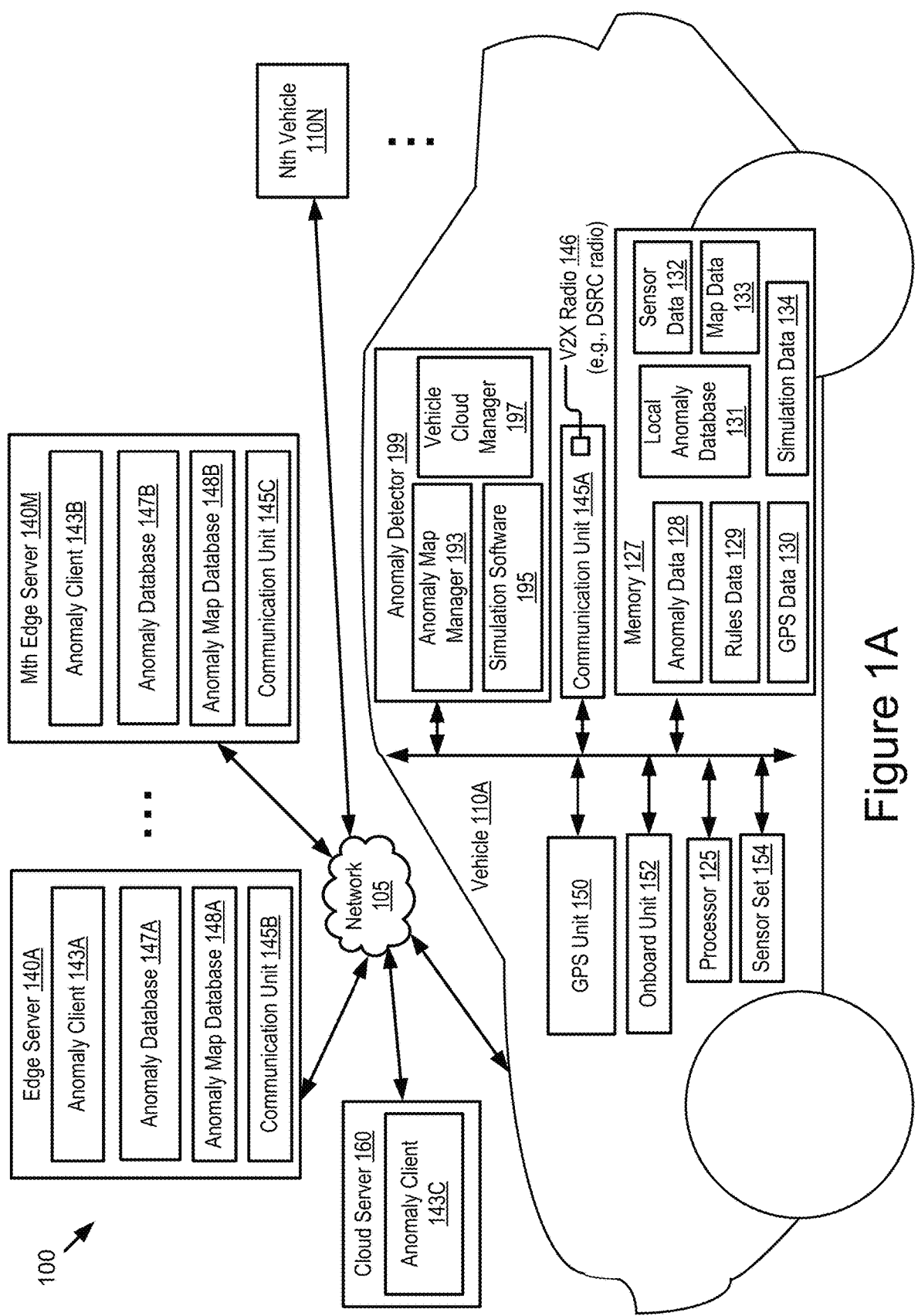
FIG. 1A is a block diagram illustrating an operating environment for an anomaly client and an anomaly detector according to some embodiments.

Connected vehicles that are located within V2X wireless communication range of one another can form a vehicular micro cloud. Such vehicles are referred to as "cloud members" or "members of the vehicular micro cloud" herein. The connected vehicles collaboratively perform computation, data storage, sensing, communication tasks and any combination thereof among the cloud members over V2X networks such as V2V networks, including but not limited to the following: (1) collaboratively performing resource-intensive computational tasks among the multiple cloud members; (2) collaboratively keeping and updating data content among the multiple cloud members; (3) collaboratively performing sensing of road conditions by on-board sensors of the multiple cloud members; and (4) collaboratively downloading or uploading data content from or to a cloud server (or an edge server).

Using vehicular micro clouds removes the need for the connected vehicles to access remote cloud servers or edge servers by V2N communications (e.g., by cellular networks) whenever they need to get access to data (e.g., high-definition road map for automated driving). Depending on mobility of the vehicular micro clouds, the vehicular micro clouds can be categorized into two types by way of examples: a stationary vehicular micro cloud; and a mobile vehicular micro cloud.

A stationary vehicular micro cloud can be tied to a certain geographical region (e.g., an intersection). A vehicle joins a stationary vehicular micro cloud when entering a pre-defined geographical region of the stationary vehicular micro cloud and leaves the stationary vehicular micro cloud when exiting from the pre-defined geographical region. When exiting from the pre-defined geographical region, the vehicle also hands over on-going tasks and data of the stationary vehicular micro cloud to other cloud members. In some embodiments, parked vehicles can also be members of the stationary vehicular micro cloud.

In a mobile vehicular micro cloud, a cloud leader (e.g., a connected vehicle which acts as a leader in the vehicular micro cloud) can invite its neighboring vehicles to join the mobile vehicular micro cloud. Unlike the stationary vehicular micro cloud, the mobile vehicular micro cloud moves as the cloud leader moves. The cloud leader recruits other cloud members into the mobile vehicular micro cloud and distributes sub-tasks to the other cloud members for collaborative task execution.

To ensure safety and cybersecurity of connected vehicles, anomaly detection is needed. For example, locations and events which do not follow an expected pattern can be identified via anomaly detection.

In existing technologies, vehicles currently use their onboard sensors to detect anomalies and create maps of these anomalies that describe where the detected anomalies occur in their environment. In some scenarios, these maps are inadequate because each vehicle that generates a respective anomaly map only has one perspective. Traditional V2X communication may be used to solve this problem, but problems such as latency and poor accuracy (e.g., due to individual decision mechanisms), single point of failure (e.g., due to fixed infrastructure), communication overhead and underdeveloped infrastructure prevent traditional V2X communication from being a suitable solution.

Generally, a vehicular micro cloud includes multiple vehicles with different computational capabilities. Each vehicle has a different view of surroundings with its available resources including, but not limited to: communication resources (e.g., for obtaining information and data from its neighboring vehicles); a vibration sensor (e.g., for obtaining road surface knowledge); and cameras (e.g., for obtaining traffic and vulnerable road user (VRU) information). As a result, a cooperative anomaly-map generation technique can be implemented in the vehicular micro cloud.

Embodiments of an anomaly detector and an anomaly client are provided herein that use vehicular micro clouds to generate improved anomaly maps. These improved anomaly maps may help a vehicle control system (e.g., an Advanced Driver Assistance System (ADAS system) or an autonomous driving system) of vehicles to function better in roadway environments where anomalies occur.

As described herein, an anomaly includes an action done in an unusual time (e.g., relative to a typical time for this particular geographic location) or an unusual location (e.g., relative to a typical location). In some embodiments, an anomaly includes an unusual action (e.g., an action that does not typically occur or infrequently occurs relative to the types of actions that are typical for a particular geographic location). In some embodiments, an anomaly includes, but is not limited to, one or more of the following: a human anomaly (e.g., a pedestrian suddenly screams); a data anomaly (e.g., false acceleration information in platooning); a road surface anomaly (e.g., a hole on a road, rocks on a road, etc.); and a traffic anomaly (e.g., a lane merge from a wrong side, a lane closure, an accident, etc.).

As described herein, examples of V2X communications include, but are not limited to, one or more of the following: Dedicated Short Range Communication (DSRC) (including Basic Safety Messages (BSMs) and Personal Safety Messages (PSMs), among other types of DSRC communication); Long-Term Evolution (LTE); millimeter wave (mmWave) communication; 3G; 4G; 5G; LTE-V2X; 5G-V2X; LTE-Vehicle-to-Vehicle (LTE-V2V); LTE-Device-to-Device (LTE-D2D); Voice over LTE (VoLTE); etc. In some examples, the V2X communications can include V2V communications, Vehicle-to-Infrastructure (V2I) communications, V2N communications or any combination thereof.

Examples of a wireless message (e.g., a V2X wireless message) described herein include, but are not limited to, the following messages: a Dedicated Short Range Communication (DSRC) message; a Basic Safety Message (BSM); a Long-Term Evolution (LTE) message; a LTE-V2X message (e.g., a LTE-Vehicle-to-Vehicle (LTE-V2V) message, a LTE-Vehicle-to-Infrastructure (LTE-V2I) message, an LTE-V2N message, etc.); a 5G-V2X message; and a millimeter wave message, etc.

Vehicular micro clouds are described in the patent applications that are incorporated by reference in this paragraph. This patent application is related to the following patent applications, the entirety of each of which is incorporated herein by reference: U.S. patent application Ser. No. 15/358,567 filed on Nov. 22, 2016 and entitled "Storage Service for Mobile Nodes in a Roadway Area"; U.S. patent application Ser. No. 15/799,442 filed on Oct. 31, 2017 and entitled "Service Discovery and Provisioning for a Macro-Vehicular Cloud"; U.S. patent application Ser. No. 15/845,945 filed on Dec. 18, 2017 and entitled "Managed Selection of a Geographical Location for a Micro-Vehicular Cloud"; and U.S. patent application Ser. No. 15/799,963 filed on Oct. 31, 2017 and entitled "Identifying a Geographic Location for a Stationary Micro-Vehicular Cloud."

Example Overview

Referring to FIG. 1A, depicted is an example operating environment 100 for an anomaly detector 199 and an anomaly client 143. For example, the operating environment 100 includes one or more vehicles 110, one or more edge servers 140 and a cloud server 160. The one or more vehicles 110 include a first vehicle 110A, . . . , and an Nth vehicle 110N, which may provide similar functionality and are referred to herein as "vehicle 110" individually or collectively, where N is a positive integer greater than or equal to one. The one or more edge servers 140 includes a first edge server 140A, . . . , and an Mth edge server 140M, which may provide similar functionality and are referred to herein as "edge server 140" individually or collectively, where M is a positive integer greater than or equal to one. These elements of the operating environment 100 may be communicatively coupled to a network 105. Optionally, the operating environment 100 further includes one or more roadside units (RSUs if plural, and RSU if singular) or other infrastructure devices (not shown in the figure).

Although two vehicles 110, two edge servers 140, one cloud server 160 and one network 105 are depicted in FIG. 1A, in practice the operating environment 100 may include one or more vehicles 110, one or more edge servers 140, one or more cloud servers 160 and one or more networks 105.

For example, there are "N" number of vehicles nearby the vehicle 110 having the anomaly detector 199. However, it is not required that all of the "N" number of vehicles include an anomaly detector. Of course, in some embodiments each of the "N" vehicles can include an anomaly detector.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS), multimedia messaging service (MMS), hypertext transfer protocol (HTTP), direct data connection, wireless application protocol (WAP), e-mail, DSRC, full-duplex wireless communication, mmWave, WiFi (infrastructure mode), WiFi (ad-hoc mode), visible light communication, TV white space communication and satellite communication. The network 105 may also include a mobile data network that may include 3G, 4G, 5G, LTE, LTE-V2V, LTE-V2I, LTE-V2X, LTE-D2D, VoLTE, 5G-V2X or any other mobile data network or combination of mobile data networks. Further, the network 105 may include one or more IEEE 802.11 wireless networks.

In some embodiments, the network 105 includes a V2X network (e.g., a V2X wireless network). The V2X network is a communication network that enables entities such as elements of the operating environment 100 to wirelessly communicate with one another via one or more of the following: Wi-Fi; cellular communication including 3G, 4G, LTE, 5G, etc.; Dedicated Short Range Communication (DSRC); millimeter wave communication; etc.

In some embodiments, the vehicle 110 may be a DSRC-equipped vehicle. A DSRC-equipped vehicle is a vehicle which: (1) includes a DSRC radio; (2) includes a DSRC-compliant Global Positioning System (GPS) unit; and (3) is operable to lawfully send and receive DSRC messages in a jurisdiction where the DSRC-equipped vehicle is located. A DSRC radio is hardware that includes a DSRC receiver and a DSRC transmitter. The DSRC radio is operable to wirelessly send and receive DSRC messages.

A DSRC-compliant GPS unit is operable to provide positional information for a vehicle (or some other DSRC-equipped device that includes the DSRC-compliant GPS unit) that has lane-level accuracy. In some embodiments, a DSRC-compliant GPS unit is operable to identify, monitor and track its two-dimensional position within 1.5 meters of its actual position 68% of the time under an open sky.

A conventional GPS unit provides positional information that describes a position of the conventional GPS unit with an accuracy of plus or minus 10 meters of the actual position of the conventional GPS unit. By comparison, a DSRC-compliant GPS unit provides GPS data that describes a position of the DSRC-compliant GPS unit with an accuracy of plus or minus 1.5 meters of the actual position of the DSRC-compliant GPS unit. This degree of accuracy is referred to as "lane-level accuracy" since, for example, a lane of a roadway is generally about 3 meters wide, and an accuracy of plus or minus 1.5 meters is sufficient to identify which lane a vehicle is traveling in on a roadway. Some safety or autonomous driving applications provided by an Advanced Driver Assistance System (ADAS) of a modern vehicle require positioning information that describes the geographic position of the vehicle with lane-level accuracy. In addition, the current standard for DSRC requires that the geographic position of the vehicle be described with lane-level accuracy.

As used herein, the words "geographic location," "location," "geographic position" and "position" refer to a latitude and longitude of an object (or, a latitude, longitude, and elevation of an object) such as a connected vehicle. The example embodiments described herein provide positioning information that describes a geographic position of a vehicle with an accuracy of one or more of: (1) at least plus or minus 1.5 meters in relation to the actual geographic position of the vehicle in 2 dimensions including a latitude and a longitude; and (2) at least plus or minus 3 meters in relation to the actual geographic position of the vehicle in an elevation dimension. Accordingly, the example embodiments described herein are able to describe the geographic position of the vehicle with lane-level accuracy or better.

The vehicle 110 may be any type of vehicle. The vehicle 110 may be one of the following types of vehicles: a car; a truck; a sports utility vehicle; a bus; a semi-truck; a drone or any other roadway-based conveyance. In some embodiments, the vehicle 110 includes a communication unit such that the vehicle is a "connected vehicle," where the communication unit includes any hardware and software that is needed to enable the vehicle 110 to communicate with other entities via the network 105.

In some embodiments, the vehicle 110 may be an autonomous vehicle or a semi-autonomous vehicle. For example, the vehicle 110 may include one or more Advanced Driver-Assistance Systems (ADAS systems). The one or more ADAS systems may provide some or all of the functionality that provides autonomous functionality.

In some embodiments, the vehicle 110 includes the anomaly detector 199, a communication unit 145A, a processor 125, a memory 127, a GPS unit 150, an onboard unit 152 and a sensor set 154.

The processor 125 includes an arithmetic logic unit, a microprocessor, a general-purpose controller, or some other processor array to perform computations and provide electronic display signals to a display device. The processor 125 processes data signals and may include various computing architectures including a complex instruction set computer (CISC) architecture, a reduced instruction set computer (RISC) architecture, or an architecture implementing a combination of instruction sets. The vehicle 110 may include one or more processors 125. Other processors, operating systems, sensors, displays, and physical configurations may be possible.

For example, the processor 125 can be an element of the onboard unit 152 or an electronic control unit of the vehicle 110.

The memory 127 stores instructions or data that may be executed by the processor 125 of the vehicle 110. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis. The vehicle 110 may include one or more memories 127.

In some embodiments, the memory 127 stores one or more of the following elements: anomaly data 128; rules data 129; GPS data 130; local anomaly database 131; sensor data 132; map data 133; and simulation data 134.

The anomaly data 128 includes digital data that describes an anomaly that is indicated by the sensor data 132. Examples of an anomaly include, but are not limited to: a human anomaly (e.g., a pedestrian suddenly screams, a pedestrian lying down on a sidewalk); a data anomaly (e.g., false acceleration information in platooning); a road surface anomaly (e.g., a hole on a road, rocks on a road, etc.); and a traffic anomaly (e.g., a lane merge from a wrong side, a lane closure, an accident, wild animals walking on the road, etc.).

The rules data 129 includes digital data that describes rules for which endpoints the anomaly detector 199 cooperates with to generate improved anomaly maps. The endpoints that cooperate with the anomaly detector 199 to generate improved anomaly maps can be referred to as "cooperation endpoints." An example of a cooperation endpoint can be a vehicle, a roadside unit or another infrastructure device in the roadway environment that is capable of observing the anomaly. For example, the cooperation endpoints cooperate with the anomaly detector 199 of the vehicle 110 to form iterations of an anomaly-map generation technique so that a process to generate an anomaly map can be iterated to improve accuracy of the anomaly map. The cooperation endpoints are described below in more detail.

The GPS data 130 may include digital data describing a geographic location of the vehicle 110. For example, the GPS data 130 includes digital data describing a latitude and longitude of the vehicle 110 (or, a latitude, longitude, and elevation of the vehicle 110). In some embodiments, an anomaly detected by the vehicle 110 occurs in the vicinity of the vehicle 110, and so, the GPS data 130 of the vehicle 110 can also be treated as describing a geographic location of the anomaly.

The local anomaly database 131 includes a data structure that includes anomalies detected by the vehicle 110 and the N vehicles 110, as well as anomaly maps generated by these entities. In some embodiments, the local anomaly database 131 also stores anomaly rules. An anomaly rule may also be referred to as an anomaly feature. Examples of an anomaly rule include, but are not limited to: a type of an anomaly; one or more conditions of the anomaly; a type of a road where the anomaly occurs (e.g., a country road where an anomaly such as wild animals walking on the road can be detected); one or more potential locations of the anomaly (e.g., a trajectory of a moving anomaly); one or more actions to take in case of an occurrence of an anomaly (e.g., one or more actions to take against the anomaly); and a simulation criterion that an updated anomaly map needs to satisfy in order to run a simulation based on the updated anomaly map (e.g., a minimum number of anomaly maps needed to simulate part of or all actions of the anomaly), etc. The simulation criterion is described below in more detail.

The sensor data 132 includes digital data that describes sensor measurements of the sensor set 154.

The map data 133 includes digital data that describes one or more anomalies. For example, the map data 133 describes one or more anomaly maps or updated anomaly maps. In another example, the map data 133 includes GPS coordinates of one or more anomalies. In some embodiments, the map data 133 describes how the one or more anomalies may affect an operating environment that includes the vehicle 110 based on simulations or emulations that are executed using a simulation software 195.

In some embodiments, the simulation software 195 includes a background technology that is operable to execute driving simulations or emulations that include the vehicle 110 (as well as other vehicles if there is any) and the anomalies, where the vehicle 110 (as well as other vehicles if there is any) is driving in a simulated version of the operating environment.

The simulation data 134 includes digital data that describes one or more outcomes of these simulations executed by the simulation software 195. For example, the simulation data 134 describes a simulation result for the anomaly. Examples of a simulation result include, but are not limited to, one or more of the following: a predicted future behavior of the anomaly; an impact of the anomaly on the roadway environment; a simulation of different views of surroundings around the anomaly; a simulation of one or more views of the anomaly in various perspectives; and a simulation of one or more actions of the anomaly in various perspectives or in a period of time.

The communication unit 145A transmits and receives data to and from the network 105 or to another communication channel. In some embodiments, the communication unit 145A may include a DSRC transceiver, a DSRC receiver and other hardware or software necessary to make the connected vehicle 110 a DSRC-enabled device. For example, the communication unit 145A includes a DSRC antenna configured to broadcast DSRC messages via the network. The DSRC antenna may also transmit BSM messages at a fixed or variable interval (e.g., every 0.1 seconds, at a time interval corresponding to a frequency range from 1.6 Hz to 10 Hz, etc.) that is user configurable.

In some embodiments, the communication unit 145A includes a port for direct physical connection to the network 105 or to another communication channel. For example, the communication unit 145A includes a USB, SD, CAT-5, or similar port for wired communication with the network 105. In some embodiments, the communication unit 145A includes a wireless transceiver for exchanging data with the network 105 or other communication channels using one or more wireless communication methods, including: IEEE 802.11; IEEE 802.16, BLUETOOTH®; EN ISO 14906: 2004 Electronic Fee Collection—Application interface EN 11253:2004 Dedicated Short-Range Communication—Physical layer using microwave at 5.8 GHz (review); EN 12795:2002 Dedicated Short-Range Communication (DSRC)—DSRC Data link layer: Medium Access and Logical Link Control (review); EN 12834:2002 Dedicated Short-Range Communication—Application layer (review); EN 13372:2004 Dedicated Short-Range Communication (DSRC)—DSRC profiles for RTTT applications (review); the communication method described in U.S. patent application Ser. No. 14/471,387 filed on Aug. 28, 2014 and entitled "Full-Duplex Coordination System"; or another suitable wireless communication method.

In some embodiments, the communication unit 145A includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145A includes a wired port and a wireless transceiver. The communication unit 145A also provides other conventional connections to the network 105 for distribution of files or media objects using standard network protocols including TCP/IP, HTTP, HTTPS, and SMTP, millimeter wave, DSRC, etc.

In some embodiments, the communication unit 145A includes a V2X radio 146 used for conducting V2X communications. For example, the V2X radio 146 includes a DSRC radio. In another example, the V2X radio 146 includes hardware, software, or a combination thereof for performing mmWave communications. Other examples of the V2X radio 146 are possible. It should be noted that DSRC is not a requirement here. Embodiments described herein can be implemented with any form of V2X communications.

In some embodiments, the GPS unit 150 is a conventional GPS unit of the vehicle 110. For example, the GPS unit 150 may include hardware that wirelessly communicates with a GPS satellite to retrieve data that describes a geographic location of the vehicle 110. For example, the GPS unit 150 retrieves GPS data from one or more GPS satellites. In some embodiments, the GPS unit 150 is a DSRC-compliant GPS unit of the vehicle 110 that is operable to provide GPS data describing the geographic location of the vehicle 110 with lane-level accuracy.

The onboard unit 152 can include one or more processors and one or more memories. For example, the onboard unit 152 includes an electronic control unit (ECU). The ECU is an embedded system in automotive electronics that controls one or more of electrical systems or subsystems in the vehicle 110. Types of the ECU include, but are not limited to, the following: Engine Control Module (ECM); Powertrain Control Module (PCM); Transmission Control Module (TCM); Brake Control Module (BCM or EBCM); Central Control Module (CCM); Central Timing Module (CTM); General Electronic Module (GEM); Body Control Module (BCM); and Suspension Control Module (SCM), etc.

In some embodiments, the anomaly detector 199 is installed in the onboard unit 152.

The sensor set 154 includes one or more sensors that are operable to measure a roadway environment outside of the vehicle 110. For example, the sensor set 154 may include one or more sensors that record one or more physical characteristics of the road environment that is proximate to the vehicle 110. The memory 127 may store sensor data that describes the one or more physical characteristics recorded by the sensor set 154. The roadway environment outside of the vehicle 110 may include the other vehicles (as well as other objects or people) in the operating environment 100, and so, one or more sensors of the sensor set 154 may record sensor data that describes information about the other vehicles (as well as other objects or people) in the operating environment 100.

In some embodiments, the sensor set 154 may include one or more of the following vehicle sensors: a camera; a LIDAR sensor; a radar sensor; a laser altimeter; an infrared detector; a motion detector; a thermostat; a sound detector, a carbon monoxide sensor; a carbon dioxide sensor; an oxygen sensor; a mass air flow sensor; an engine coolant temperature sensor; a throttle position sensor; a crank shaft position sensor; an automobile engine sensor; a valve timer; an air-fuel ratio meter; a blind spot meter; a curb feeler; a defect detector; a Hall effect sensor, a manifold absolute pressure sensor; a parking sensor; a radar gun; a speedometer; a speed sensor; a tire-pressure monitoring sensor; a torque sensor; a transmission fluid temperature sensor; a turbine speed sensor (TSS); a variable reluctance sensor; a vehicle speed sensor (VSS); a water sensor; a wheel speed sensor; and any other type of automotive sensor.

For example, the sensor set 154 includes any sensors which are needed to detect one or more anomalies occurring in the roadway environment that includes the vehicle 110. Examples of suitable sensors include, but are not limited to: exterior mounted cameras; LIDAR; radar; and other range-finding sensors, etc.

In some embodiments, the anomaly detector 199 includes software that is operable, when executed by the processor 125 of the vehicle 110, to cause the processor 125 to execute one or more operations performed in FIGS. 1B-1E or one or more steps of methods 300, 350, 400 and 500 with reference to FIGS. 3A-5B.

In some embodiments, the anomaly detector 199 may be implemented using hardware including a field-programmable gate array ("FPGA") or an application-specific integrated circuit ("ASIC"). In some other embodiments, the anomaly detector 199 may be implemented using a combination of hardware and software. The anomaly detector 199 may be stored in a combination of the devices (e.g., vehicles or other devices), or in one of the devices.

In some embodiments, the anomaly detector 199 is installed in the onboard unit 152 of the vehicle 110 (e.g., an electronic control unit or some other onboard vehicle computer). The anomaly detector 199 includes one or more of the following elements: an anomaly map manager 193; the simulation software 195; and a vehicle cloud manager 197. In some embodiments, the vehicle cloud manager 197 can be part of an anomaly client 143 that is installed in a server. In some embodiments, the vehicle cloud manager 197, the anomaly map manager 193 and the anomaly detector 199 are separate entities as shown in FIG. 1E.

In some embodiments, the anomaly detector 199 builds an anomaly map that describes a location of an anomaly. Based on the detected anomaly, the anomaly detector 199 transmits a wireless message to the anomaly client 143 with instructions that a vehicular micro cloud needs to be formed at a geographic location of the vehicle 110 (or, at a geographic location of the anomaly).

In some embodiments, a matching sub-routine is executed by the anomaly detector 199 so that the anomaly detector 199 only cooperates on generating an updated anomaly map with certain vehicles whose location or sensor assets make them best able to generate the best possible anomaly map. The anomaly detector 199 may include rules or other routines that coordinate sensors, resources or a combination thereof of the certain vehicles to focus on the anomaly and govern this process. The rules data describes these rules.

If the anomaly detector 199 of the vehicle 110 determines that the updated anomaly map includes enough information (e.g., the updated anomaly map satisfies a simulation criterion), then the anomaly detector 199 performs simulations or emulations to predict a future behavior or an impact of the anomaly and this information is added to the updated anomaly maps. In this way, the anomaly detectors 199 of multiple vehicles may share these updated anomaly maps among one another to arrive at a consensus decision about the future behavior or impact of the anomaly, and the updated anomaly map may be further modified with this decision. The anomaly detector 199 of the vehicle 110 uploads the updated anomaly map to the anomaly client 143 via a wireless network where it can be further improved and distributed.

The anomaly detector 199, as well as the anomaly map manager 193 and the vehicle cloud manager 197, is further described below with reference to FIGS. 1B-5B.

The edge server 140 includes a processor-based computing device which is installed in a roadside unit ("RSU") or some other processor-based infrastructure component of a roadway. In the operating environment 100 illustrated in FIG. 1A, the roadway includes M edge servers 140A . . . 140M, where M is any positive integer greater than or equal to one. The edge server 140A includes an anomaly client 143A, an anomaly database 147A, an anomaly map database 148A and a communication unit 145B. The edge server 140M includes an anomaly client 143B, an anomaly database 147B, an anomaly map database 148B and a communication unit 145C.

In some embodiments, edge servers 140 are not available. For example, roadside units may not be available in rural environments to serve as edge servers. Accordingly, the cloud server 160 can host an instance of the anomaly client (e.g., an anomaly client 143C) so that this cloud-based anomaly client can serve rural vehicles. Accordingly, embodiments described herein can be applied in urban environments as well as rural environments.

The communication units 145A, 145B and 145C may have similar structure and provide similar functionality. Thus, the communication units 145A, 145B and 145C can be referred to as "communication unit 145" individually or collectively. Similar description for the communication units 145B and 145C are not repeated here.

The anomaly databases 147A and 147B may have similar structure and provide similar functionality. Thus, the anomaly databases 147A and 147B can be referred to as "anomaly database 147" individually or collectively.

The anomaly database 147 may include a data structure that stores anomalies received at the edge server 140. In some embodiments, the anomaly database 147 also stores anomaly rules (or, anomaly features). The anomaly rules are described above, and similar description is not repeated here. In some embodiments, the anomaly database 147 may be distributed within a coverage area of a vehicular micro cloud over a V2I or V2N network. For example, the anomaly rules of the anomaly database 147 may be transmitted to the vehicle 110 and stored in the local anomaly database 131 of the vehicle 110.

The anomaly map databases 148A and 148B may have similar structure and provide similar functionality. Thus, the anomaly map databases 148A and 148B can be referred to as "anomaly map database 148" individually or collectively.

In some embodiments, the anomaly map database 148 include a data structure that stores (1) anomaly map information describing anomaly maps, (2) updated anomaly map information describing updated anomaly maps or (3) a combination thereof received at the edge server 140. The anomaly maps or the updated anomaly maps are generated in a vehicular micro cloud. For example, an updated anomaly map may be inserted with time stamps, location labels or a combination thereof. In another example, the updated anomaly map includes at least part of or all information needed to simulate part of or all actions of a detected anomaly. The anomaly map information or the updated anomaly map information stored in the anomaly map database 148 may be post-processed by the edge server 140 or the cloud server 160 to refine the anomaly rules in the anomaly database 147.

The anomaly clients 143A, 143B and 143C may have similar structure and provide similar functionality. Thus, the anomaly clients 143A, 143B and 143C can be referred to as "anomaly client 143" individually or collectively.

The anomaly client 143 includes software installed on one or more of endpoints of the network 105 depicted in FIG. 1A. As depicted, the anomaly client 143 is installed in the edge server 140 or the cloud server 160. The anomaly client 143 includes code and routines that are operable, when executed by a processor of the edge server 140 or the cloud server 160, to cause the processor to execute operations including, but not limited to: building the anomaly database 147; distributing anomaly maps (or updated anomaly maps) to vehicles; and instructing vehicles to build a stationary or mobile vehicular micro cloud responsive to a vehicle detecting a presence of an anomaly.

In some embodiments, part of the functionality of the anomaly client 143 can be provided by the vehicle cloud manager 197 or the anomaly map manager 193.

In some embodiments, the anomaly client 143 may be implemented using hardware including a field-programmable gate array ("FPGA") or an application-specific integrated circuit ("ASIC"). In some other embodiments, the anomaly client 143 may be implemented using a combination of hardware and software. The anomaly client 143 may be stored in a combination of the devices (e.g., the edge server 140, the cloud server 160, the vehicle 110 or other devices), or in one of the devices.

Figure 1B:
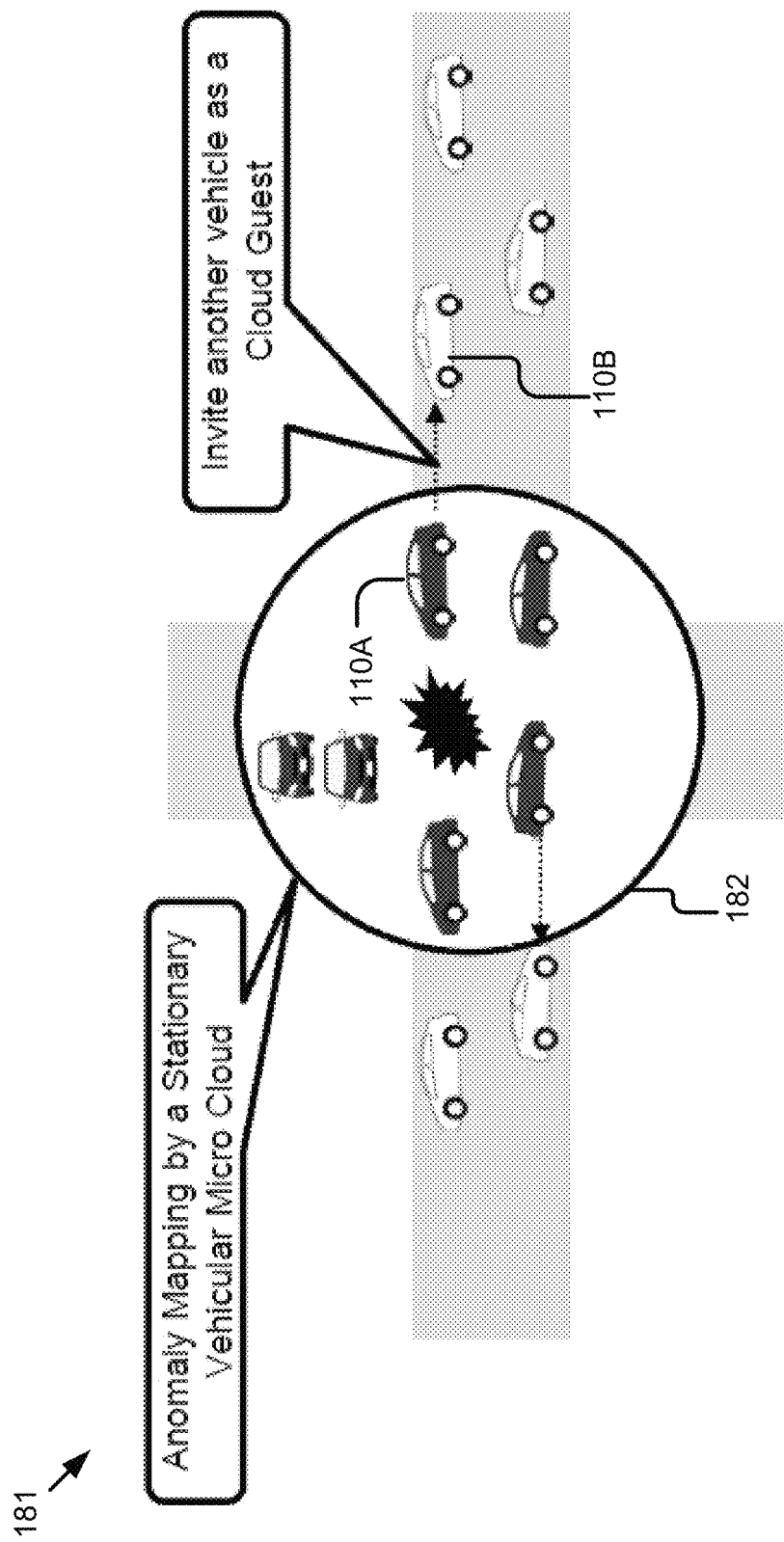
FIG. 1B is a graphic representation illustrating a formation of a stationary vehicular micro cloud for an anomaly-map generation technique according to some embodiments.

Referring to FIG. 1B, an example graphical representation 181 for forming a stationary vehicular micro cloud 182 for an anomaly-map generation technique is illustrated according to some embodiments. For example, responsive to detecting an anomaly that occurs at an intersection shown in FIG. 1B, the stationary vehicular micro cloud 182 can be formed at the intersection. The stationary vehicular micro cloud 182 may include multiple vehicles as cloud members that are located in a region covering the intersection. In this case, the vehicles in the stationary vehicular micro cloud 182 may generate their respective anomaly maps describing the anomaly and share the respective anomaly maps with one another.

At least one of the vehicles (e.g., a cloud leader or any other cloud member) may generate an updated anomaly map based on the shared anomaly maps. In some embodiments, a vehicle (e.g., vehicle 110A) in the stationary vehicular micro cloud 182 may also invite another vehicle (e.g., vehicle 110B) that is not a member of the stationary vehicular micro cloud 182 as a cloud guest in order to coordinate sensors and resources of the other vehicle (e.g., vehicle 110B) so that the other vehicle focuses on the anomaly. The other vehicle may generate sensor data related to the anomaly (e.g., image data depicting the anomaly from the perspective of the other vehicle). The other vehicle may send the sensor data to the vehicle (e.g., vehicle 110A) so that the vehicle can generate its own anomaly map further based on the sensor data of the other vehicle. Alternatively, the other vehicle generates its own anomaly map and sends its own anomaly map to the vehicle so that the vehicle can generate an updated anomaly map based on the anomaly map of the vehicle itself and the anomaly map of the other vehicle as well as any other anomaly maps shared in the stationary vehicular micro cloud 182.

A vehicle that generates an updated anomaly map can run a simulation for the anomaly based on the updated anomaly map and generate a simulation result. The updated anomaly map is further modified to include the simulation result and shared among the vehicles in the stationary vehicular micro cloud 182. A consensus decision on the updated anomaly map (as well as the simulation result) can be reached in the stationary vehicular micro cloud 182 (e.g., 80% or all of the vehicles in the stationary vehicular micro cloud 182 agree that the simulation result has sufficiently depicted actions of the anomaly in different perspectives). The updated anomaly map can be uploaded by the vehicle to the edge server 140 or the cloud server 160 for further improvement and distribution.

Figure 1C:
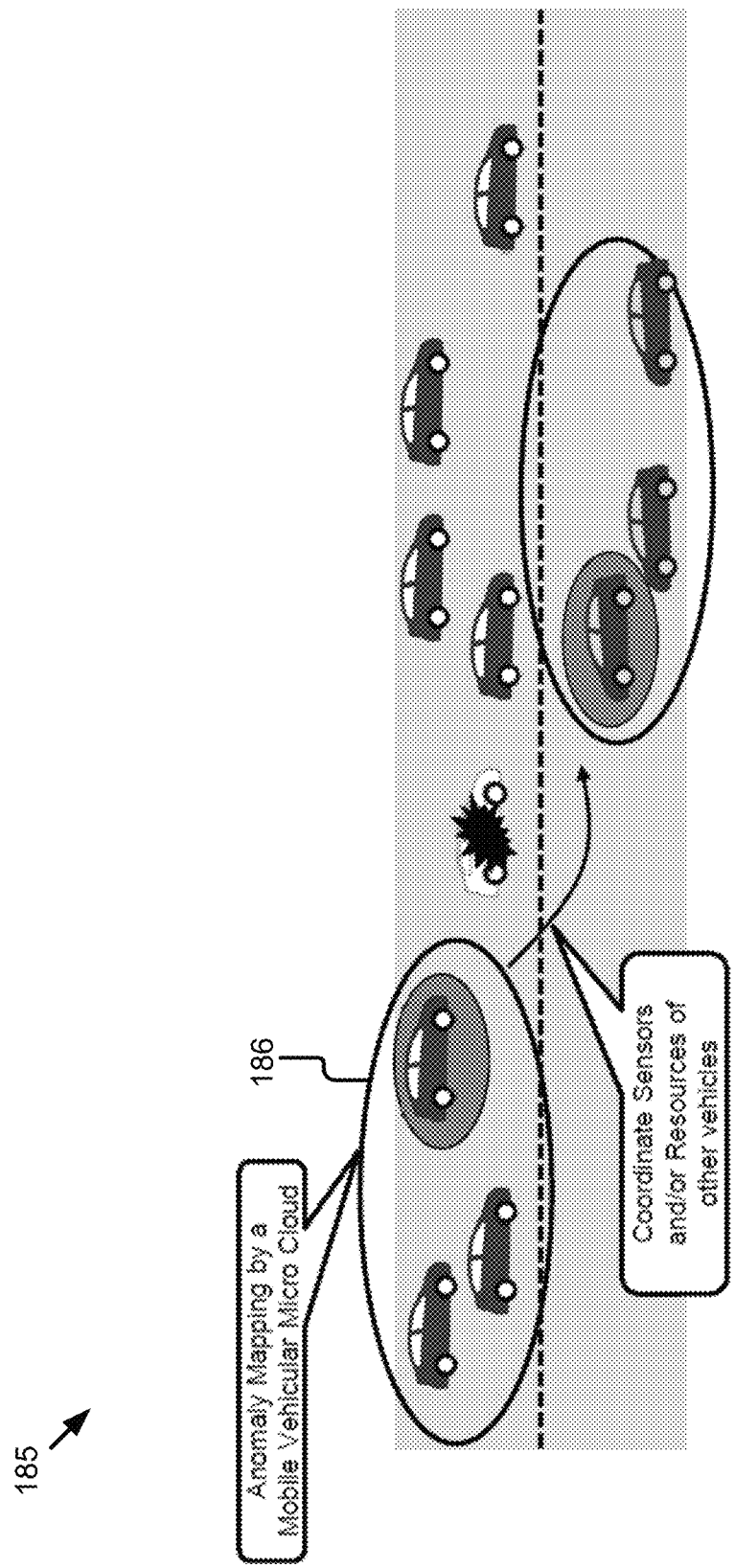
FIG. 1C is a graphic representation illustrating a formation of a mobile vehicular micro cloud for an anomaly-map generation technique according to some embodiments.

Referring to FIG. 1C, an example graphical representation 185 for forming a mobile vehicular micro cloud 186 for an anomaly-map generation technique is illustrated according to some embodiments. For example, responsive to detecting a moving anomaly that occurs on a road shown in FIG. 1C, a mobile vehicular micro cloud 186 can be formed to follow a trajectory of the moving anomaly. The mobile vehicular micro cloud 186 may include multiple vehicles as cloud members that are located in a vicinity of the moving anomaly. Operations similar to those described above in FIG. 1B can be performed in the mobile vehicular micro cloud 186 including, but not limited to: (1) generating anomaly maps describing the anomaly by one or more vehicles in the mobile vehicular micro cloud 186; (2) sharing the anomaly maps with one another in the mobile vehicular micro cloud 186; (3) inviting one or more other vehicles that are not members of the mobile vehicular micro cloud 186 as cloud guests in order to coordinate sensors and resources of the one or more other vehicles so that the one or more other vehicles focus on the anomaly (e.g., the one or more other vehicles are invited as cooperation endpoints for the anomaly-map generation technique); (4) generating an updated anomaly map based on (a) the anomaly maps shared in the mobile vehicular micro cloud 186, (b) the anomaly maps received from the one or more other vehicles or (c) a combination thereof; (5) running a simulation for the anomaly based on the updated anomaly map to generate a simulation result; (6) modifying the updated anomaly map further to include the simulation result and sharing the updated anomaly map among the vehicles in the mobile vehicular micro cloud 186; (7) reaching a consensus decision on the updated anomaly map (as well as the simulation result) in the mobile vehicular micro cloud 186 (e.g., 70% or all of the vehicles in the mobile vehicular micro cloud 186 agree that the simulation result has sufficiently depicted actions of the anomaly in different perspectives); and (8) uploading the updated anomaly map to the edge server 140 or the cloud server 160 for further improvement and distribution. These operations can be performed by a single vehicle or multiple vehicles in the mobile vehicular micro cloud 186.

With combined reference to FIGS. 1B-1C, when an anomaly is detected, a vehicular micro cloud can be formed correspondingly. Anomaly map information (describing the anomaly maps) or updated anomaly map information (describing the updated anomaly map) can be generated and shared among cloud members of the vehicular micro cloud. A simulation or emulation can be run to simulate, for example, part of or all actions of the anomaly in different perspective. That is, a simulation for the anomaly can be created retrospectively using the vehicular micro cloud. The updated anomaly map (which may include the simulation result) can be uploaded to one or more of the edge server 140 and the cloud server 160.

Figure 1D:
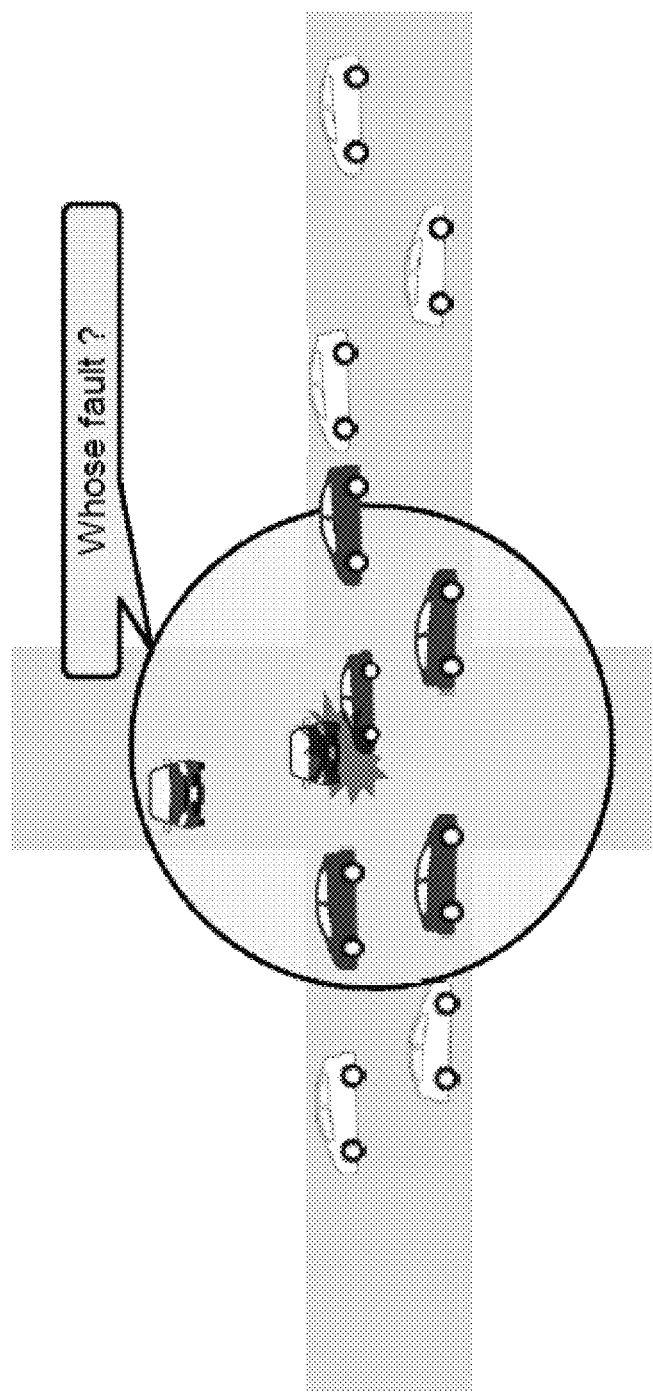
FIG. 1D is a graphic representation illustrating an example use case of an anomaly-map generation technique according to some embodiments.
Figure 1E:
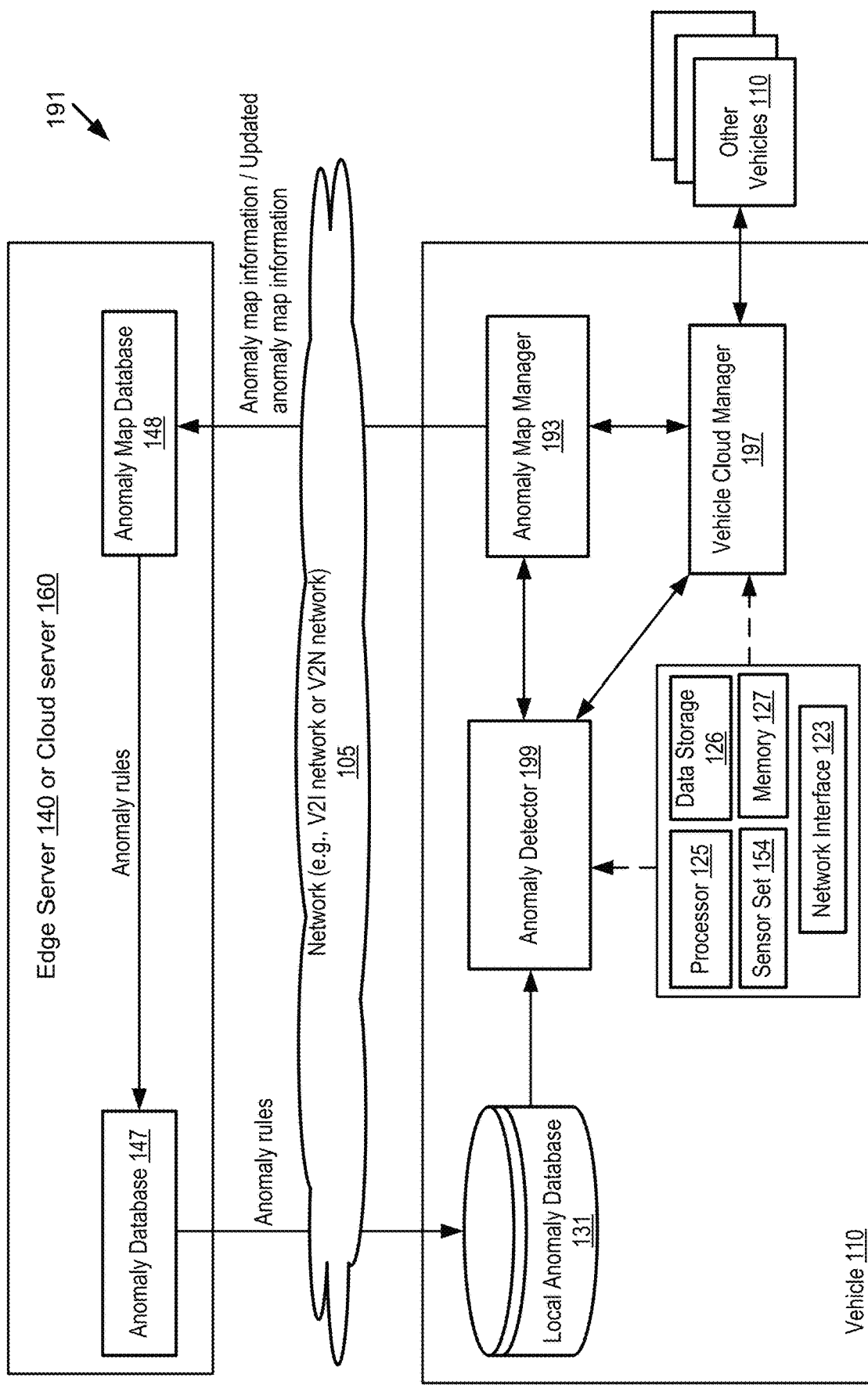
FIG. 1E is a block diagram illustrating a system overview of an anomaly-map generation technique according to some embodiments.

An example use case of this anomaly-map generation technique includes a traffic accident scenario shown in FIG. 1D. By applying the anomaly-map generation technique described herein, an accident scenario shown in FIG. 1D can be simulated retrospectively to determine a fault percentage of each party that involves in a collision. Other example use cases are also possible.

FIG. 1E is a block diagram illustrating a system overview 191 of the anomaly-map generation technique using a vehicular micro cloud according to some embodiments. The vehicle 110 includes, for example, the processor 125, a data storage 126 for storing data, the sensor set 154, the memory 127 and a network interface 123.

In some embodiments, the vehicle 110 may receive anomaly-rule data describing anomaly rules from the edge server 140 or the cloud server 160, and stores this anomaly-rule data in the local anomaly database 131. The anomaly detector 199 receives sensor data from the sensor set 154 (e.g., sensor readings are illustrated by dashed arrow lines in FIG. 1E). The anomaly detector 199 uses the sensor data and the anomaly-rule data to detect an occurrence of an anomaly. For example, the anomaly detector 199 continuously monitors sensor measurements from onboard sensors. In a case that the anomaly detector 199 finds a match to an anomaly rule based on the sensor measurements (e.g., the anomaly rule describes one or more conditions under which an anomaly occurs), the anomaly detector 199 detects an occurrence of the anomaly.

The anomaly detector 199 also uses the sensor data and the anomaly-rule data to generate an anomaly map describing the anomaly. The anomaly detector 199 sends anomaly map data describing the anomaly map to the anomaly map manager 193. Alternatively, the anomaly map is generated by the anomaly map manager 193 based on the sensor data and the anomaly-rule data. The anomaly map manager 193 can upload anomaly map information describing the anomaly map to the edge server 140 or the cloud server 160.

The anomaly map manager 193 or the anomaly detector 199 sends an instruction to form a vehicular micro cloud to the vehicle cloud manager 197 so that the vehicle cloud manager 197 of the vehicle 110 forms the vehicular micro cloud with other vehicles 110. For example, the vehicle cloud manager 197 performs coordination with the other vehicles 110 to form the vehicular micro cloud. In another example, the anomaly detector 199 instructs the vehicle cloud manager 197 to form a vehicle micro cloud based on characteristics of the anomaly (e.g., if the anomaly is mobile, then a mobile vehicular micro cloud is constructed).

In some embodiments, the vehicle cloud manager 197 may perform one or more of the following operations: (1) performing maintenance of intra-micro cloud wireless links; (2) controlling resource utilization and collaborative task execution in the vehicular micro cloud; (3) sharing anomaly map information (or updated anomaly map information) with cloud members; and (4) inviting a cloud guest to the vehicular micro cloud and coordinating sensors, resources or a combination thereof of the cloud guest. In some embodiments, the vehicle cloud manager 197 also performs any existing solutions for clustering and platooning in vehicular ad-hoc networks.

After the vehicular micro cloud is formed, the anomaly map manager 193 may receive anomaly maps created by the other vehicles 110 in the vehicular micro cloud via the vehicle cloud manager 197. The anomaly map manager 193 generates an updated anomaly map based on the anomaly map created by the vehicle 110 and the anomaly maps created by the other vehicles 110.

For example, the anomaly map manager 193 selects one or more cooperation endpoints for the anomaly-map generation so that the one or more cooperation endpoints generate one or more anomaly maps and send the one or more anomaly maps to the vehicle 110. The one or more cooperation endpoints can be either cloud members or cloud guests of the vehicular micro cloud whose locations or sensor assets make them best able to generate a best possible anomaly map. The anomaly map manager 193 uses the one or more anomaly maps created by the one or more cooperation endpoints and the anomaly map created by the vehicle 110 itself to generate the updated anomaly map.

In some examples, the anomaly map manager 193 selects the one or more cooperation endpoints as one or more of: an endpoint that is located in a region of interest associated with the anomaly (e.g., an endpoint located in the vicinity of the anomaly); an endpoint that has been in the region of interest for a period of time that exceeds a time threshold (e.g., an endpoint that has been in the region of interest for the longest period of time); an endpoint that is expected to remain in the region of interest for a period of time that exceeds the time threshold (e.g., an endpoint that is expected to be in the region of interest for the longest period of time); and an endpoint with a known trajectory, a known timetable or a combination thereof (for example, in a case where network access is unavailable temporarily, a constructed anomaly map can be uploaded to the edge server 140 or the cloud server 160 at a later time because the endpoint has a known trajectory, a known timetable or a combination thereof; in another example, actions of the anomaly can be searched in the known trajectory, the known timetable or a combination thereof). The region of interest associated with the anomaly can be, for example, a region where the vehicular micro cloud is formed or a region within a certain range from a geographic location of the anomaly.

The anomaly map manager 193 runs a simulation for the anomaly based on the updated anomaly map to generate a simulation result and modifies the updated anomaly map to include the simulation result. The anomaly map manager 193 can share the updated anomaly map among the vehicles 110 in the vehicular micro cloud. A consensus decision on the updated anomaly map (as well as the simulation result) can be reached in the vehicular micro cloud. The anomaly map manager 193 modifies the updated anomaly map further to include the consensus decision and uploads updated anomaly map information describing the updated anomaly map to the edge server 140 or the cloud server 160 for further improvement and distribution.

The anomaly client 143 installed in the edge server 140 or the cloud server 160 can store the anomaly map information or the updated anomaly map information in the anomaly map database 148. The anomaly client 143 may analyze the anomaly map information or the updated anomaly map information to generate or refine anomaly rules and store the anomaly rules in the anomaly database 147.

In some embodiments, the anomaly-map generation technique described herein satisfies a set of anomaly mapping requirements including, but not limited to: one or more anomaly feature constraints (e.g., a type of an anomaly, a sensitivity level of the anomaly, a time-to-live of the anomaly, actions against the anomaly, a minimum number of anomaly maps needed to simulate a scenario of the anomaly, etc.); and one or more geographical constraints (e.g., a region where an anomaly map targets, with the region being specified by absolute coordinates or relative coordinates with respect to a certain anomaly position). These anomaly mapping requirements can be described by the anomaly rules stored in the anomaly database 147 or the local anomaly database 131.

A first example advantage of the anomaly-map generation technique described herein includes that the anomaly detector 199 incorporates a vehicle's onboard anomaly map as part of a scheme to improve anomaly detection and anomaly-map generation.

A second example advantage of the anomaly-map generation technique described herein includes that, unlike existing solutions where an anomaly is detected and an anomaly map is generated by a single vehicle, the anomaly-map generation technique described herein constructs a vehicular micro cloud by nearby resources (e.g., nearby vehicle resources), where the vehicular micro cloud is approximate to a geographical location of the anomaly. Furthermore, cloud members of the vehicular micro cloud can invite other vehicles or endpoints as cloud guests to coordinate sensors, resources or a combination thereof of the cloud guests to focus on the anomaly. For example, an inviting cloud member can determine: (a) one or more sensors of an invited cloud guest to be activated; (b) an angle of a camera sensor of the invited cloud guest to be focused on; (c) or a zoom level of the camera sensor of the invited cloud guest, etc.

A third example advantage of the anomaly-map generation technique described herein includes that the cloud members of the vehicular micro cloud can share the anomaly maps with each other so that: (1) different views of surroundings of the anomaly are constructed; (2) at least part of or all actions of the anomaly can be simulated retrospectively; and (3) a final decision or a consensus decision is made cooperatively in the vehicular micro cloud by considering part of or all simulated actions.

Other example advantages of the anomaly-map generation technique described herein include, but are not limited to: (a) a detection of an anomaly by a vehicle provides prior knowledge and a specific scene to new cloud members on what to look at; (b) anomaly detection accuracy is improved and anomaly detection latency is reduced; (c) a retrospective simulation of the anomaly's actions is provided; and (d) a cooperative collection of events for a standardized anomaly dataset is aggregated.

Example Computer System

Figure 2:
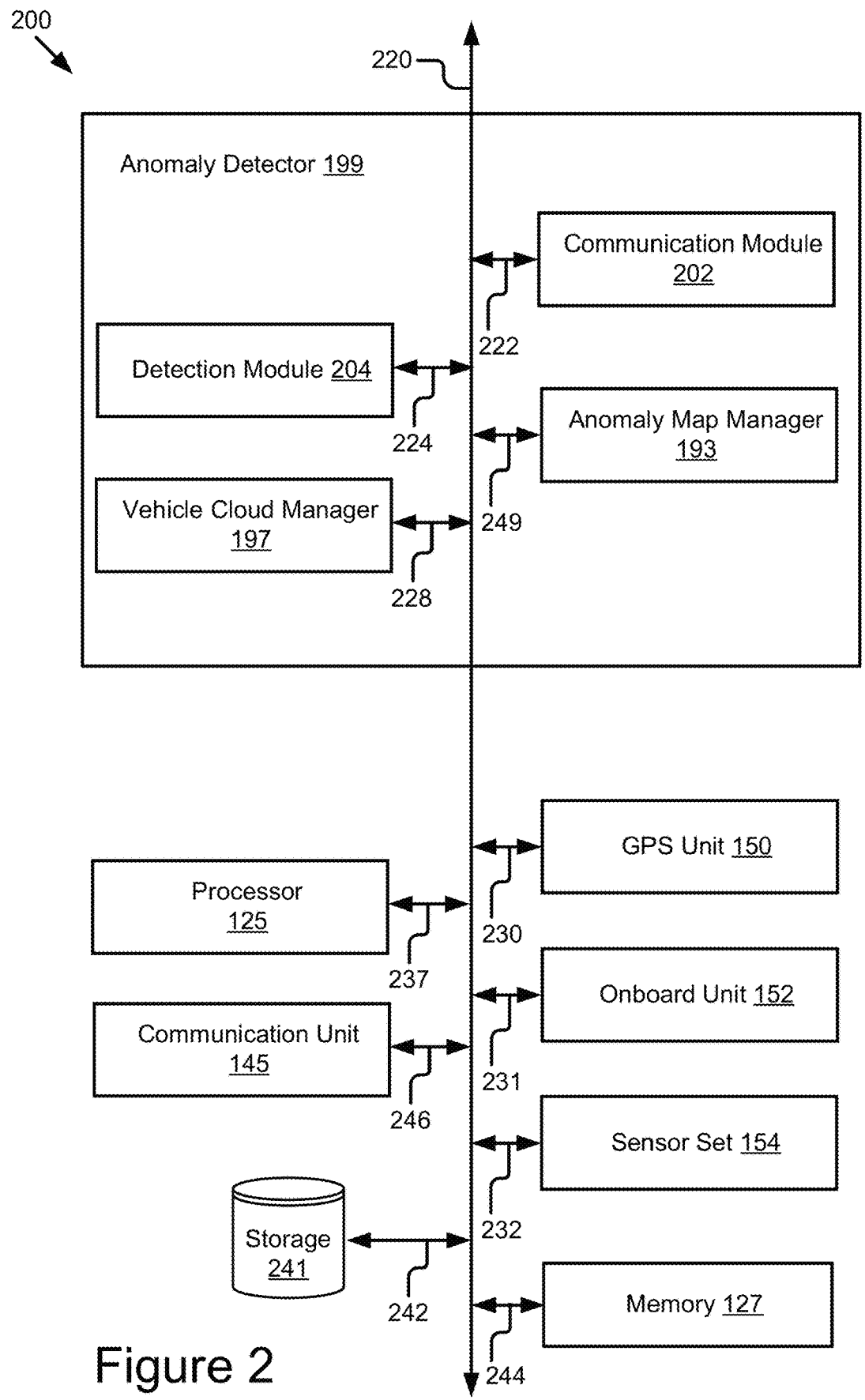
FIG. 2 is a block diagram illustrating an example computer system including an anomaly detector according to some embodiments.

Referring now to FIG. 2, depicted is a block diagram illustrating an example computer system 200 including the anomaly detector 199 according to some embodiments. In some embodiments, the computer system 200 may include a special-purpose computer system that is programmed to perform one or more steps of methods 300, 350, 400 and 500 described below with reference to FIGS. 3A-5B.

In some embodiments, the computer system 200 is an on-board vehicle computer of the vehicle 110. In some embodiments, the computer system 200 is an onboard unit of the vehicle 110. In some embodiments, the computer system 200 is an electronic control unit (ECU), head unit or some other processor-based computing device of the vehicle 110.

The computer system 200 may include one or more of the following elements according to some examples: the anomaly detector 199; the processor 125; the memory 127; the communication unit 145; the GPS unit 150; the onboard unit 152; the sensor set 154; and a storage 241. The components of the computer system 200 are communicatively coupled by a bus 220.

In the illustrated embodiment, the processor 125 is communicatively coupled to the bus 220 via a signal line 237. The communication unit 145 is communicatively coupled to the bus 220 via a signal line 246. The GPS unit 150 is communicatively coupled to the bus 220 via a signal line 230. The onboard unit 152 is communicatively coupled to the bus 220 via a signal line 231. The sensor set 154 is communicatively coupled to the bus 220 via a signal line 232. The storage 241 is communicatively coupled to the bus 220 via a signal line 242. The memory 127 is communicatively coupled to the bus 220 via a signal line 244.

The processor 125, the memory 127, the communication unit 145, the GPS unit 150, the onboard unit 152 and the sensor set 154 are described above with reference to FIG. 1A, and so, similar description will not be repeated here. The memory 127 may store any of the data described above with reference to FIGS. 1A-1E. The memory 127 may store any data necessary for the computer system 200 to provide its functionality.

The storage 241 can be a non-transitory storage medium that stores data for providing the functionality described herein. The storage 241 may be a dynamic random-access memory (DRAM) device, a static random-access memory (SRAM) device, flash memory, or some other memory devices. In some embodiments, the storage 241 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

In the illustrated embodiment shown in FIG. 2, the anomaly detector 199 includes: a communication module 202; a detection module 204; the anomaly map manager 193; and the vehicle cloud manager 197. These components of the anomaly detector 199 are communicatively coupled to each other via the bus 220. In some embodiments, components of the anomaly detector 199 can be stored in a single device. In some other embodiments, components of the anomaly detector 199 can be distributed and stored across multiple devices.

The communication module 202 can be software including routines for handling communications between the anomaly detector 199 and other components of the computer system 200. In some embodiments, the communication module 202 can be stored in the memory 127 of the computer system 200 and can be accessible and executable by the processor 125. The communication module 202 may be adapted for cooperation and communication with the processor 125 and other components of the computer system 200 via a signal line 222.

The communication module 202 sends and receives data, via the communication unit 145, to and from one or more elements of the operating environment 100. For example, the communication module 202 receives or transmits, via the communication unit 145, one or more of the following elements: anomaly-rule data; anomaly map information; and updated anomaly map information. The communication module 202 may send or receive any of the data or messages described above with reference to FIGS. 1A-1E via the communication unit 145.

In some embodiments, the communication module 202 receives data from components of the anomaly detector 199 and stores the data in one or more of the storage 241 and the memory 127. For example, the communication module 202 receives data described above with reference to the memory 127 from the communication unit 145 (via the network 105, a DSRC message, a BSM, a DSRC probe, a full-duplex wireless message, etc.) and stores this data in the memory 127 (or temporarily in the storage 241 which may act as a buffer for the computer system 200).

In some embodiments, the communication module 202 may handle communications between components of the anomaly detector 199. For example, the communication module 202 may handle communications among the detection module 204, the anomaly map manager 193 and the vehicle cloud manager 197. Any of these systems or modules may cause the communication module 202 to communicate with the other elements of the computer system 200 or the operating environment 100 (via the communication unit 145).

In some embodiments, the detection module 204 can be software including routines for detecting an occurrence of an anomaly. In some embodiments, the detection module 204 can be a set of instructions stored in the memory 127 of the computer system 200 and can be accessible and executable by the processor 125. The detection module 204 may be adapted for cooperation and communication with the processor 125 and other components of the computer system 200 via a signal line 224.

In some embodiments, the detection module 204 causes one or more sensors of the sensor set 154 to record sensor data describing a roadway environment of the vehicle 110. The detection module 204 receives the sensor data from the one or more sensors. Alternatively or additionally, the detection module 204 of the vehicle 110 may receive sensor data recorded by another endpoint located in the roadway environment via a V2X wireless message generated by the other endpoint. The other endpoint may be, for example, another vehicle, a roadside unit or any other infrastructure device in the roadway environment.

The detection module 204 detects an occurrence of an anomaly in the roadway environment based on the sensor data. For example, if the sensor data includes image data depicting a scene of a road closure, the detection module 204 may determine that the sensor data satisfies a condition for a "road closure" anomaly described by an anomaly rule stored in the local anomaly database 131. Therefore, the detection module 204 detects an occurrence of the "road closure" anomaly.

In some embodiments, the detection module 204 creates an anomaly map that describes the anomaly based on the sensor data. For example, the sensor data may record one or more of the following from a perspective of the vehicle 110: one or more views of a surrounding around the anomaly; one or more views of the anomaly; one or more actions of the anomaly; and one or more remedy actions against the anomaly, etc. The detection module 204 may create an anomaly map that includes a geographic location of the anomaly and one or more of the following from the perspective of the vehicle 110: the one or more views of the surrounding around the anomaly; the one or more views of the anomaly; the one or more actions of the anomaly; and the one or more remedy actions against the anomaly, etc. In some embodiments, the detection module 204 may send anomaly map information describing the anomaly map created by the vehicle 110 to the anomaly map manager 193.

Here, a remedy action against an anomaly may be, for example, an action that is taken to make remedy for an occurrence of the anomaly. For example, in a case of an anomaly such as an extremely-icy road surface, an action describing that a vehicle traveling on the road turns on its emergency lights can be considered as a remedy action against the anomaly.

Alternatively or additionally, the anomaly map describing the anomaly can be created by the anomaly map manager 193 of the vehicle 110 based on the sensor data by performing operations similar to those described above for the detection module 204. In this case, the detection module 204 can send the sensor data to the anomaly map manager 193 after detecting the occurrence of the anomaly so that the sensor data can be used by the anomaly map manager 193 to create the anomaly map.

The anomaly map manager 193 can be software including routines that, when executed by the processor 125, cause the processor 125 to manage anomaly maps associated with an anomaly. In some embodiments, the anomaly map manager 193 can be a set of instructions stored in the memory 127 of the computer system 200 and can be accessible and executable by the processor 125. The anomaly map manager 193 may be adapted for cooperation and communication with the processor 125 and other components of the computer system 200 via a signal line 249.

In some embodiments, the anomaly map manager 193 generates an instruction to form a vehicular micro cloud responsive to the occurrence of the anomaly and sends the instruction to the vehicle cloud manager 197 or the anomaly client 143. For example, the instruction causes a formation of the vehicular micro cloud that includes the vehicle 110 and one or more nearby vehicles approximate to the anomaly as cloud members of the vehicular micro cloud. The formation of the vehicular micro cloud is further described below in more detail with reference to the vehicle cloud manager 197.

After the vehicular micro cloud is formed, the anomaly map manager 193 may receive, from one or more cooperation endpoints, one or more other anomaly maps that are created by the one or more cooperation endpoints. The one or more anomaly maps also describe the anomaly. Each of the one or more cooperation endpoints can be a cloud member or a cloud guest of the vehicular micro cloud that cooperates with the vehicle 110 for the anomaly-map generation.

In some embodiments, the one or more cooperation endpoints are determined by the anomaly map manager 193 based on one or more anomaly mapping policies. An anomaly mapping policy can be, for example, a rule or policy for selecting a cooperation endpoint for the anomaly-map generation. For example, an anomaly mapping policy may describe that a cooperation endpoint can be selected to be: an endpoint that is located in a region of interest associated with the anomaly (e.g., an endpoint located in the vicinity of the anomaly); an endpoint that has been in the region of interest for a period of time that exceeds a time threshold (e.g., an endpoint that has been in the region of interest for the longest period of time); an endpoint that is expected to remain in the region of interest for a period of time that exceeds the time threshold (e.g., an endpoint that is expected to be in the region of interest for the longest period of time); or an endpoint with a known trajectory, a known timetable or a combination thereof. Other example anomaly mapping policies are possible.

In some embodiments, the anomaly map manager 193 generates an updated anomaly map based on the anomaly map created by the vehicle 110 and the one or more other anomaly maps created by the one or more cooperation endpoints so that an accuracy of the updated anomaly map is improved. For example, the anomaly map manager 193 aggregates first information included in the anomaly map created by the vehicle 110 and second information included in the one or more other anomaly maps created by the one or more cooperation endpoints to form the updated anomaly map so that the updated anomaly map includes the first information included in the anomaly map and the second information included in the one or more other anomaly maps.

In a further example, assume that two other anomaly maps are received from two cooperation endpoints respectively. Each of the two other anomaly maps includes a respective view of the anomaly from one perspective. The anomaly map created by the vehicle 110 includes a view of the anomaly from a perspective of the vehicle 110. Then, the anomaly map manager 193 generates the updated anomaly map based on the anomaly map created by the vehicle 110 and the two other anomaly maps created by the two cooperation endpoints so that the updated anomaly map includes three views of the anomaly from three perspectives.

In some embodiments, the anomaly map manager 193 determines whether the updated anomaly map satisfies a simulation criterion. A satisfaction of the simulation criterion includes, but is not limited to, one or more of: a total number of anomaly maps used to generate the updated anomaly map satisfies a map threshold (e.g., a total number of anomaly maps used for the simulation satisfies the map threshold); a total number of views of the anomaly in the updated anomaly map satisfies a view threshold; a total number of actions of the anomaly in the updated anomaly map satisfies an action threshold; a time window of the actions of the anomaly in the updated anomaly map satisfies a time-window threshold; and a total number of remedy actions reacted against the anomaly satisfies a reaction threshold. For example, a satisfaction of the simulation criterion indicates that the updated anomaly map includes sufficient information for running a simulation for the anomaly (e.g., sufficient information to run a simulation for the anomaly so that at least part of or all of the actions of the anomaly can be simulated retrospectively).

In some embodiments, the map threshold is a minimum number of anomaly maps needed to generate an updated anomaly map (e.g., a minimum number of anomaly maps to simulate part of or all actions of the anomaly). For example, since the updated anomaly map is generated based on multiple anomaly maps created by the vehicle 110 and the cooperation endpoints, a total number of the multiple anomaly maps used to generate the updated anomaly map needs to be no less than the map threshold (e.g., the total number of the multiple anomaly maps is no less than the minimum number of anomaly maps in order to simulate 50%, 80% or 100% of the actions of the anomaly). If a total number of the anomaly maps used to generate the updated anomaly map is equal to or greater than the map threshold, then the updated anomaly map satisfies the map threshold.

In some embodiments, the view threshold is a minimum number of views of the anomaly needed to be collected in the updated anomaly map. For example, assume that the updated anomaly map is generated based on two anomaly maps (with each anomaly map having two views of the anomaly from two different angles). Then, the updated anomaly map has four different views of the anomaly. If a total number of views of the anomaly collected in the updated anomaly map is equal to or greater than the view threshold, then the updated anomaly map satisfies the view threshold.

In some embodiments, the action threshold is a minimum number of actions needed to be collected in the updated anomaly map. For example, assume that the updated anomaly map is generated based on two anomaly maps (with a first anomaly map created by the vehicle 110 having one action of the anomaly and a second anomaly map created by a cooperation endpoint having two actions of the anomaly). Then, the updated anomaly map has three actions of the anomaly. If a total number of actions of the anomaly collected in the updated anomaly map is equal to or greater than the action threshold, then the updated anomaly map satisfies the action threshold.

In some embodiments, the time-window threshold is a minimum time duration of the actions that is needed to be collected in the updated anomaly map. For example, the updated anomaly map has a series of actions of the anomaly that lasts for a particular period of time. If the particular period of time is equal to or greater than the time-window threshold, then the updated anomaly map satisfies the time-window threshold.

In some embodiments, the reaction threshold is a minimum number of remedy actions needed to be collected in the updated anomaly map. For example, assume that the updated anomaly map is generated based on two anomaly maps (with a first anomaly map having one remedy action against the anomaly and a second anomaly map having two remedy actions against the anomaly). Then, the updated anomaly map has three remedy actions against the anomaly. If a total number of remedy actions against the anomaly collected in the updated anomaly map is equal to or greater than the reaction threshold, then the updated anomaly map satisfies the reaction threshold.

Then, responsive to the updated anomaly map satisfying the simulation criterion, the anomaly map manager 193 performs a simulation for the anomaly to generate a simulation result based on the updated anomaly map. For example, the anomaly map manager 193 may instruct the simulation software 195 to run a simulation for the anomaly based on the information included in the updated anomaly map.

In some embodiments, the simulation result includes, but is not limited to, one or more of: a predicted future behavior of the anomaly; an impact of the anomaly on the roadway environment; a simulation of different views of surroundings around the anomaly; a simulation of one or more views of the anomaly in various perspectives; a simulation of one or more actions of the anomaly in various perspectives; a simulation of one or more actions of the anomaly in a period of time; and a simulation of one or more remedy actions against the anomaly.

On the other hand, responsive to the updated anomaly map not satisfying the simulation criterion, the anomaly map manager 193 determines one or more additional cooperation endpoints in the roadway environment, and coordinates one or more sensors, one or more computing resources or a combination thereof of each additional cooperation endpoint to focus on the anomaly so that one or more additional anomaly maps are generated by the one or more additional cooperation endpoints. In this case, additional information about the anomaly can be captured by the one or more additional anomaly maps. The anomaly map manager 193 receives the one or more additional anomaly maps from the one or more additional cooperation endpoints via the vehicle cloud manager 197, and generates the updated anomaly map further based on the one or more additional anomaly maps. For example, the updated anomaly map is modified to further include the additional information about the anomaly that is collected in the one or more additional anomaly maps. Then, the anomaly map manager 193 continues to determine whether the updated anomaly map satisfies the simulation criterion. In some embodiments, the anomaly map manager 193 may repeat these operations until the updated anomaly map satisfies the simulation result so that a simulation can be run for the anomaly to generate a simulation result.

In some embodiments, the anomaly map manager 193 may modify the updated anomaly map based on the simulation result. For example, the anomaly map manager 193 may incorporate the simulation result into the updated anomaly map so that the simulation result can be viewed via the updated anomaly map.

In some embodiments, the anomaly map manager 193 instructs the vehicle cloud manager 197 to share the updated anomaly map information describing the updated anomaly map in the vehicular micro cloud. The anomaly map manager 193 may receive one or more other updated anomaly maps from one or more other cloud members of the vehicular micro cloud via the vehicle cloud manager 197.

In some embodiments, the anomaly map manager 193 may arrive at a consensus decision with the one or more other cloud members about the updated anomaly map (as well as the simulation result for the anomaly) based on: (1) the updated anomaly map generated by the vehicle 110; and (2) the one or more other updated anomaly maps generated by the one or more other cloud members. For example, if the updated anomaly map and the one or more other updated anomaly maps each have a similar description for an impact of the anomaly on the roadway environment, then the anomaly map manager 193 reaches a consensus decision with the one or more other cloud members about the impact of the anomaly on the roadway environment (that is, a consensus decision about the impact of the anomaly on the roadway environment is arrived in the vehicular micro cloud).

Next, the anomaly map manager 193 modifies the updated anomaly map further based on the consensus decision. For example, the anomaly map manager 193 may incorporate the consensus decision into the updated anomaly map so that the consensus decision can be viewed via the updated anomaly map. The anomaly map manager 193 may upload the updated anomaly map information describing the updated anomaly map to a server (e.g., the edge server 140 or the cloud server 160) by sending a V2X wireless message that includes the updated anomaly map information to the server.

The vehicle cloud manager 197 can be software including routines that, when executed by the processor 125, cause the processor 125 to create and manage a vehicular micro cloud. In some embodiments, the vehicle cloud manager 197 can be a set of instructions stored in the memory 127 of the computer system 200 and can be accessible and executable by the processor 125. The vehicle cloud manager 197 may be adapted for cooperation and communication with the processor 125 and other components of the computer system 200 via a signal line 228.

In some embodiments, responsive to the occurrence of the anomaly, the vehicle cloud manager 197 receives an instruction to form a vehicular micro cloud from the anomaly map manager 193. Depending on characteristics of the anomaly, the vehicular micro cloud formed by the vehicle cloud manager 197 can be a stationary or mobile vehicular micro cloud. For example, the vehicular micro cloud is a stationary vehicular micro cloud formed at a location of the anomaly when the anomaly is static. In another example, the vehicular micro cloud is a mobile vehicular micro cloud formed at a current location of the anomaly or upcoming consecutive locations of the anomaly when the anomaly is movable. The vehicle cloud manager 197 modifies an operation of the communication unit 145 of the vehicle 110 to instruct a formation of the vehicular micro cloud.

For example, the vehicle cloud manager 197 modifies one or more operation elements of the communication unit 145 to transmit the instruction to a server (e.g., the edge server 140 or the cloud server 160), where the instruction causes the server to form the vehicular micro cloud that includes the vehicle 110 and one or more nearby vehicles approximate to the anomaly as cloud members of the vehicular micro cloud.

In another example, responsive to receiving the instruction from the anomaly map manager 193, the vehicle cloud manager 197 modifies one or more operation elements of the communication unit 145 to communicate with one or more nearby vehicles approximate to the anomaly so that the one or more nearby vehicles are invited by the vehicle 110 to join the vehicular micro cloud.

In some embodiments, the one or more operation elements of the communication unit 145 include one or more of the following: one or more active V2X channels to be operated on the communication unit 145; one or more active V2X radios to be operated on the communication unit 145; one or more active V2X antennas to be operated on the communication unit 145; one or more operating frequencies of the one or more active V2X channels; one or more beamforming techniques performed on the one or more active V2X antennas; and a bandwidth allocation scheme of the communication unit 145.

For example, when forming the vehicular micro cloud responsive to the occurrence of the anomaly, the vehicle cloud manager 197 can modify one or more of the following operation elements of the communication unit 145: (1) increasing the number of active V2X channels so that more V2X channels can be used to communicate with nearby vehicles simultaneously; (2) changing a beamforming technique applied on one or more V2X antennas so that a signal transmitted to a nearby vehicle with a farther distance may have a higher signal strength; and (3) allocating more bandwidth to the communication unit 145 so that information can be exchanged with other nearby vehicles once they join the vehicular micro cloud. In this way, communication efficiency in the vehicular micro cloud can be improved.

In some embodiments, the vehicle cloud manager 197 modifies the operation of the communication unit 145 to share anomaly map information describing the anomaly map created by the vehicle 110 in the vehicular micro cloud so that the one or more other anomaly maps are received from the one or more cooperation endpoints for the generation of the updated anomaly map as described above. For example, the vehicle cloud manager 197 modifies one or more operation elements of the communication unit 145 to (1) transmit the anomaly map to one or more other cloud members of the vehicular micro cloud and to (2) receive the one or more other anomaly maps from the one or more cooperation endpoints.

For example, the vehicle cloud manager 197 coordinates one or more sensors, one or more computing resources or a combination thereof of each cooperation endpoint to focus on the anomaly so that the one or more other anomaly maps are generated by the one or more cooperation endpoints and sent to the anomaly map manager 193 via the vehicle cloud manager 197.

In some embodiments, responsive to the updated anomaly map not satisfying the simulation criterion (which means that additional information about the anomaly is needed in order to run a simulation for the anomaly), the anomaly map manager 193 determines one or more additional cooperation endpoints in the roadway environment for the collection of the additional information. The vehicle cloud manager 197 coordinates one or more sensors, one or more computing resources or a combination thereof of each additional cooperation endpoint to focus on the anomaly so that one or more additional anomaly maps are generated by the one or more additional cooperation endpoints and sent to the anomaly map manager 193 via the vehicle cloud manager 197. For example, the vehicle cloud manager 197 modifies the operation of the communication unit 145 to receive the one or more additional anomaly maps from the one or more additional cooperation endpoints and sends the one or more additional anomaly maps to the anomaly map manager 193.

In some embodiments, the vehicle cloud manager 197 modifies the operation of the communication unit 145 to share the updated anomaly map information in the vehicular micro cloud. For example, the vehicle cloud manager 197 modifies one or more operation elements of the communication unit 145 to (1) send the updated anomaly map created by the vehicle 110 to one or more other cloud members of the vehicular micro cloud and (2) to receive one or more other updated anomaly maps from the one or more other cloud members of the vehicular micro cloud. The vehicle cloud manager 197 forwards the one or more other updated anomaly maps to the anomaly map manager 193.

Example Processes

Figure 3A:
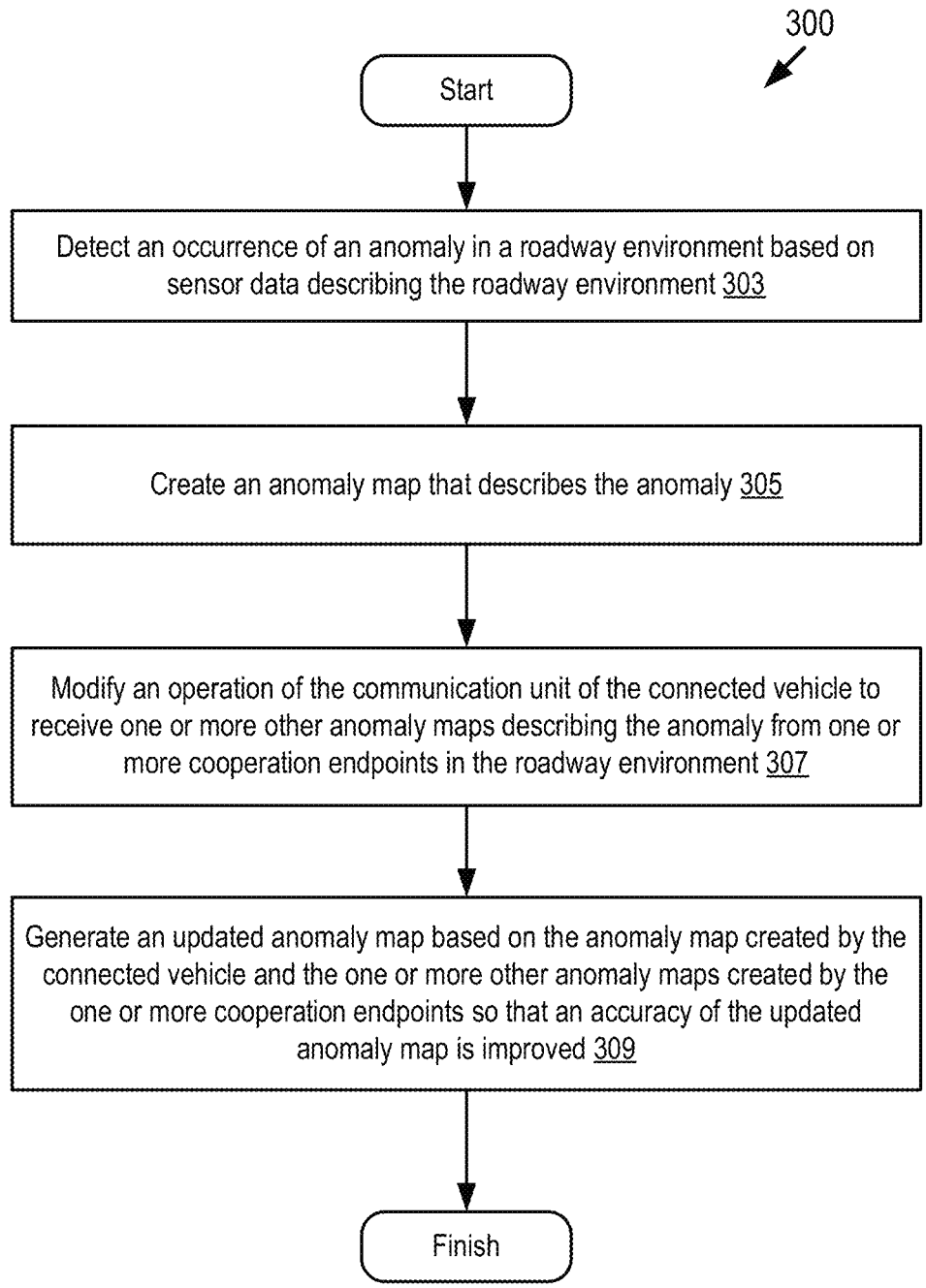
FIG. 3A depicts a method for generating improved anomaly maps according to some embodiments.

Referring now to FIG. 3A, depicted is a flowchart of an example method 300 for generating improved anomaly maps according to some embodiments. The steps of the method 300 are executable in any order, and not necessarily the order depicted in FIG. 3A. Here, assume that the method 300 is performed by a connected vehicle (e.g., the vehicle 110).

At step 303, the detection module 204 detects an occurrence of an anomaly in a roadway environment based on sensor data describing the roadway environment.

At step 305, the detection module 204 creates an anomaly map that describes the anomaly. Alternatively, the anomaly map can be created by the anomaly map manager 193 based on the sensor data.

At step 307, the vehicle cloud manager 197 modifies an operation of the communication unit 145 of the connected vehicle to receive one or more other anomaly maps describing the anomaly from one or more cooperation endpoints in the roadway environment.

At step 309, the anomaly map manager 193 generates an updated anomaly map based on the anomaly map created by the connected vehicle and the one or more other anomaly maps created by the one or more cooperation endpoints so that an accuracy of the updated anomaly map is improved.

Figure 3B:
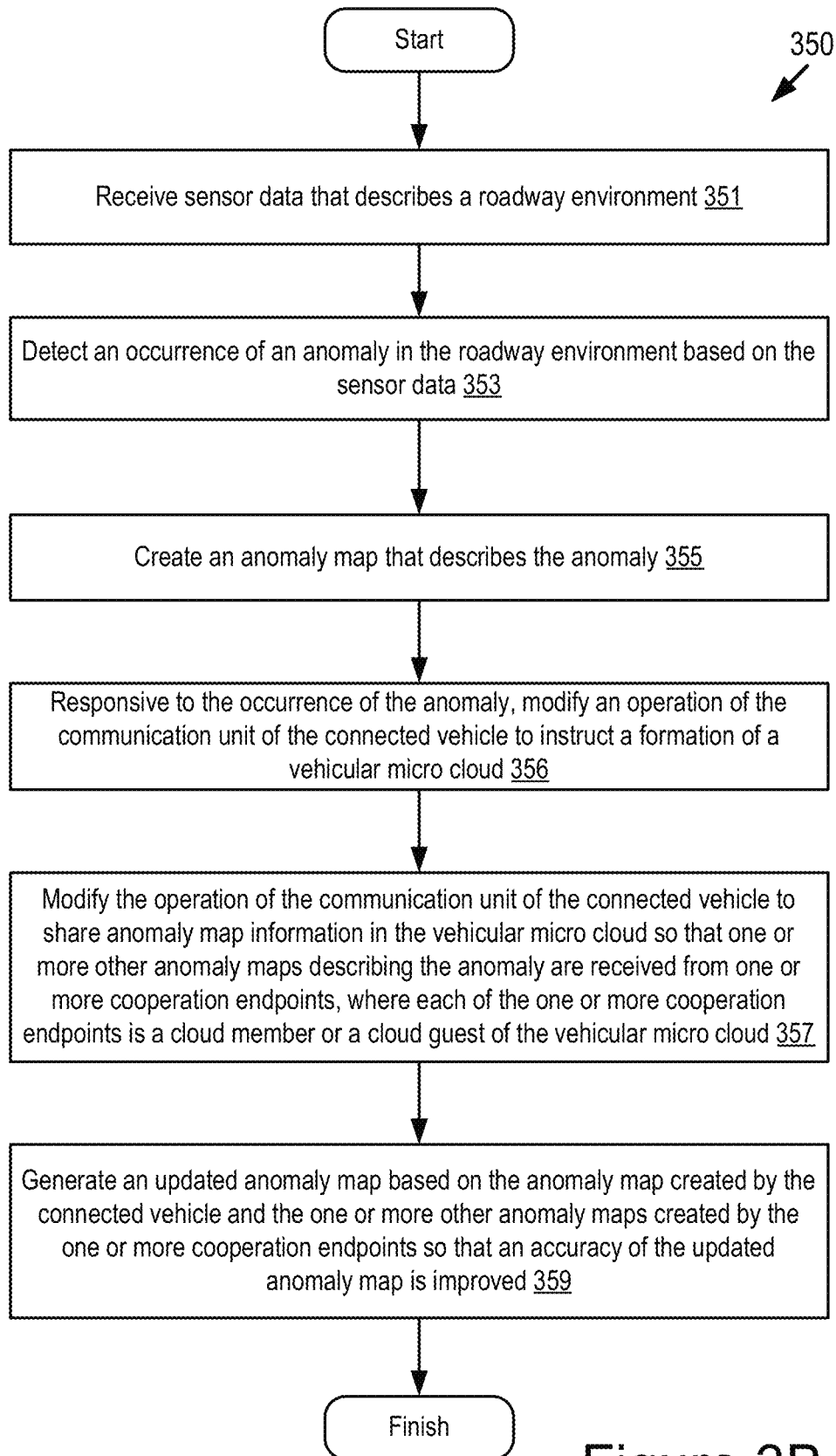
FIG. 3B depicts another method for generating improved anomaly maps according to some embodiments.

FIG. 3B depicts another method 350 for generating improved anomaly maps according to some embodiments. The steps of the method 350 are executable in any order, and not necessarily the order depicted in FIG. 3B. Here, assume that the method 350 is performed by a connected vehicle (e.g., the vehicle 110).

At step 351, the detection module 204 receives sensor data that describes a roadway environment.

At step 353, the detection module 204 detects an occurrence of an anomaly in the roadway environment based on the sensor data.

At step 355, the detection module 204 or the anomaly map manager 193 creates an anomaly map that describes the anomaly based on the sensor data.

At step 356, responsive to the occurrence of the anomaly, the vehicle cloud manager 197 modifies an operation of the communication unit 145 of the connected vehicle to instruct a formation of a vehicular micro cloud.

At step 357, the vehicle cloud manager 197 modifies the operation of the communication unit 145 of the connected vehicle to share anomaly map information in the vehicular micro cloud so that one or more other anomaly maps describing the anomaly are received from one or more cooperation endpoints, where each of the one or more cooperation endpoints is a cloud member or a cloud guest of the vehicular micro cloud.

At step 359, the anomaly map manager 193 generates an updated anomaly map based on the anomaly map created by the connected vehicle and the one or more other anomaly maps created by the one or more cooperation endpoints so that an accuracy of the updated anomaly map is improved.

FIGS. 4A-4D depict yet another method 400 for generating improved anomaly maps according to some embodiments. The steps of the method 400 are executable in any order, and not necessarily the order depicted in FIGS. 4A-4D. Here, assume that the method 400 is performed by a connected vehicle (e.g., the vehicle 110).

Figure 4A:
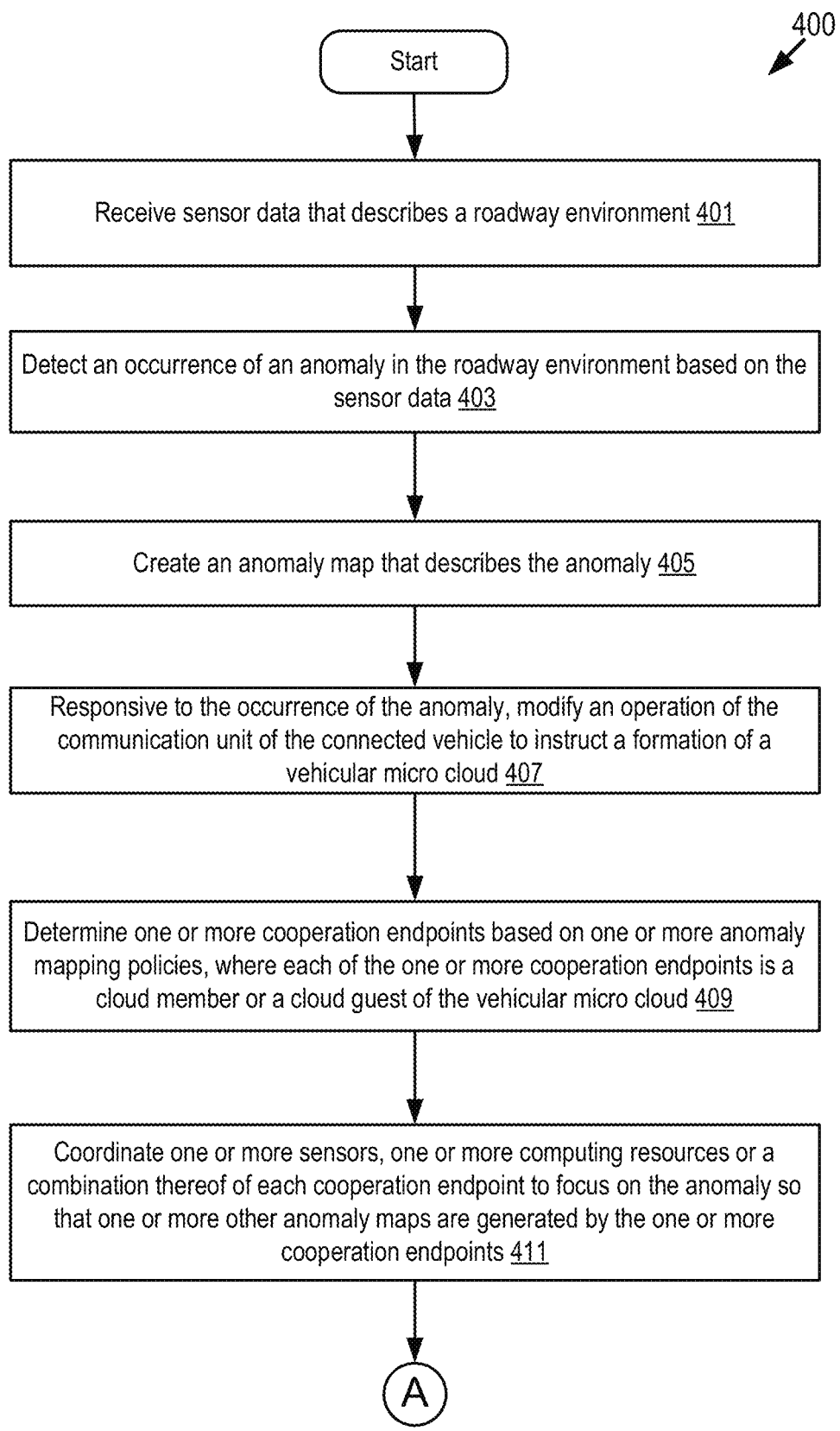
FIGS. 4A-4D depict yet another method for generating improved anomaly maps according to some embodiments.

Referring to FIG. 4A, at step 401, the detection module 204 receives sensor data that describes a roadway environment.

At step 403, the detection module 204 detects an occurrence of an anomaly in the roadway environment based on the sensor data.

At step 405, the detection module 204 or the anomaly map manager 193 creates an anomaly map that describes the anomaly.

At step 407, responsive to the occurrence of the anomaly, the vehicle cloud manager 197 modifies an operation of the communication unit 145 of the connected vehicle to instruct a formation of a vehicular micro cloud.

At step 409, the anomaly map manager 193 determines one or more cooperation endpoints based on one or more anomaly mapping policies, where each of the one or more cooperation endpoints is a cloud member or a cloud guest of the vehicular micro cloud.

At step 411, the vehicle cloud manager 197 coordinates one or more sensors, one or more computing resources or a combination thereof of each cooperation endpoint to focus on the anomaly so that one or more other anomaly maps are generated by the one or more cooperation endpoints.

Figure 4B:
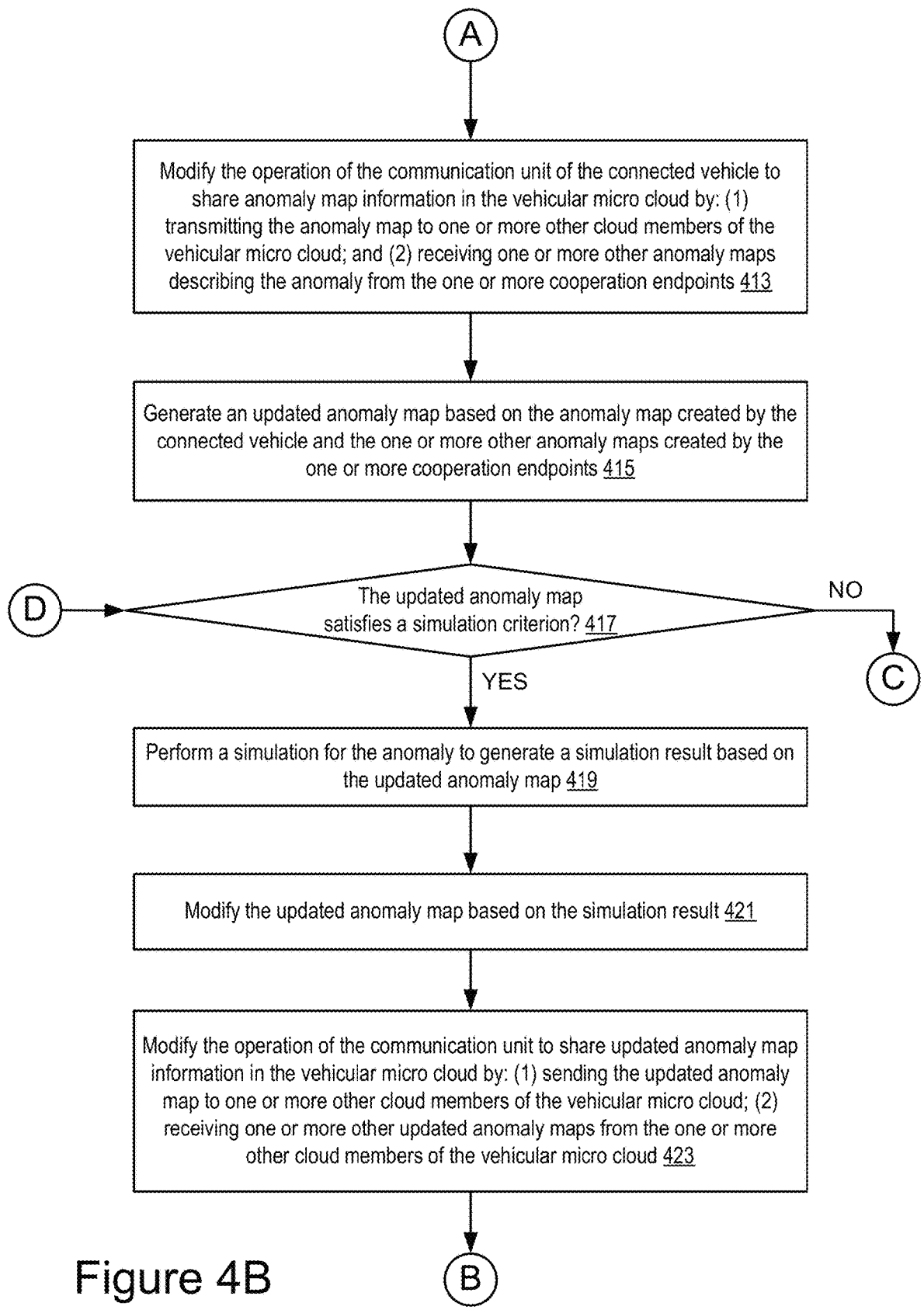

Referring to FIG. 4B, at step 413, the vehicle cloud manager 197 modifies the operation of the communication unit 145 of the connected vehicle to share anomaly map information in the vehicular micro cloud by: (1) transmitting the anomaly map to one or more other cloud members of the vehicular micro cloud; and (2) receiving one or more other anomaly maps describing the anomaly from the one or more cooperation endpoints.

At step 415, the anomaly map manager 193 generates an updated anomaly map based on the anomaly map created by the connected vehicle and the one or more other anomaly maps created by the one or more cooperation endpoints.

At step 417, the anomaly map manager 193 determines whether the updated anomaly map satisfies a simulation criterion. Responsive to the updated anomaly map satisfies the simulation criterion, the method 400 moves to step 419. Otherwise, the method 400 moves to step 429 at FIG. 4D.

At step 419, the anomaly map manager 193 performs a simulation for the anomaly to generate a simulation result based on the updated anomaly map.

At step 421, the anomaly map manager 193 modifies the updated anomaly map based on the simulation result.

At step 423, the vehicle cloud manager 197 modifies the operation of the communication unit 145 to share updated anomaly map information in the vehicular micro cloud by: (1) sending the updated anomaly map to one or more other cloud members of the vehicular micro cloud; (2) receiving one or more other updated anomaly maps from the one or more other cloud members of the vehicular micro cloud.

Figure 4C:
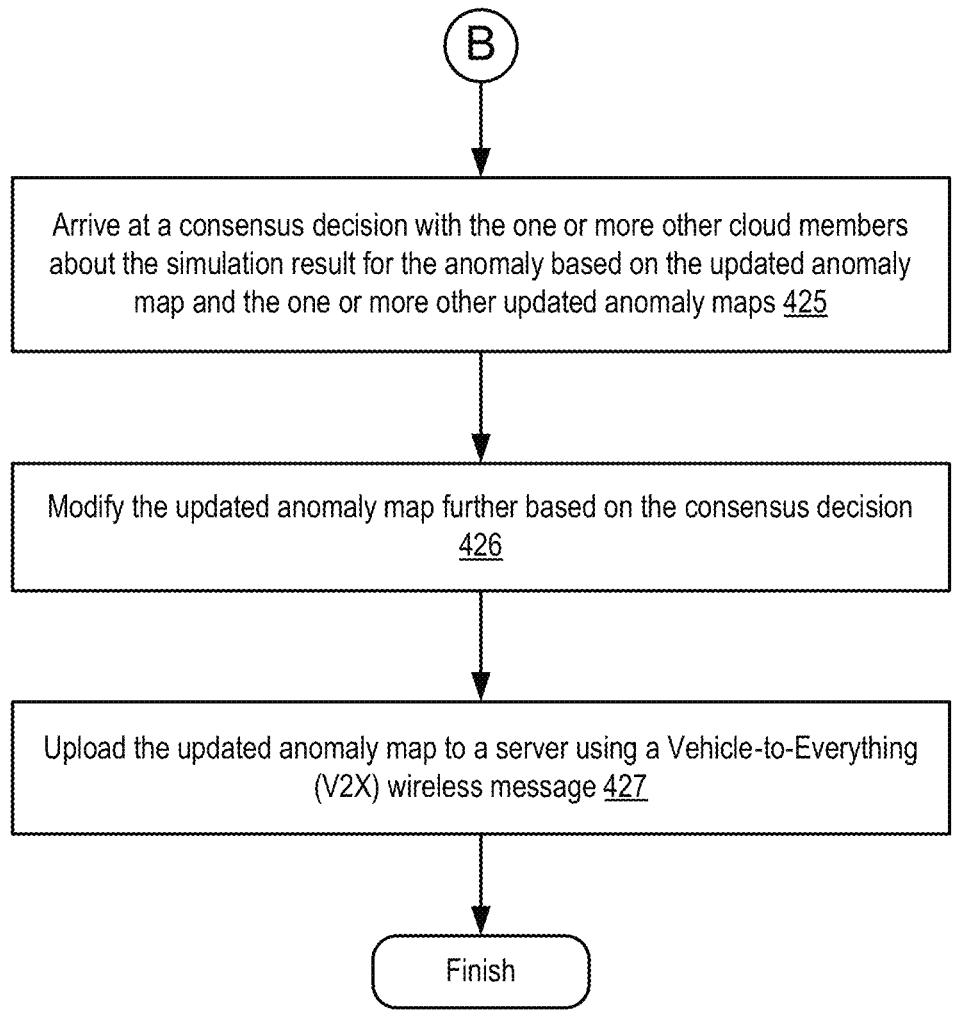

Referring to FIG. 4C, at step 425, the anomaly map manager 193 arrives at a consensus decision with the one or more other cloud members about the simulation result for the anomaly based on the updated anomaly map and the one or more other updated anomaly maps.

At step 426, the anomaly map manager 193 modifies the updated anomaly map further based on the consensus decision.

At step 427, the anomaly map manager 193 uploads the updated anomaly map to a server using a V2X wireless message.

Figure 4D:
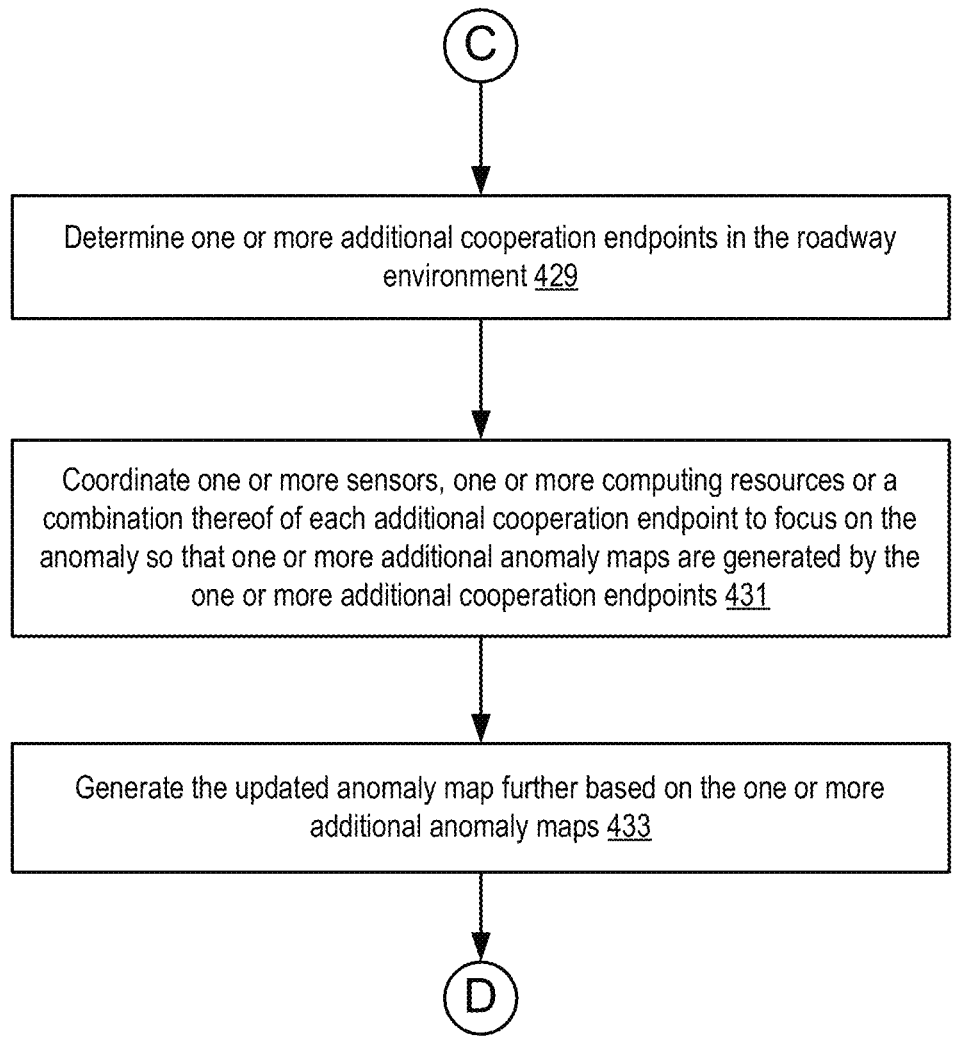

Referring to FIG. 4D, at step 429, the anomaly map manager 193 determines one or more additional cooperation endpoints in the roadway environment.

At step 431, the vehicle cloud manager 197 coordinates one or more sensors, one or more computing resources or a combination thereof of each additional cooperation endpoint to focus on the anomaly so that one or more additional anomaly maps are generated by the one or more additional cooperation endpoints.

At step 433, the anomaly map manager 193 generates the updated anomaly map further based on the one or more additional anomaly maps. Then, the method 400 moves back to step 417 of FIG. 4B.

Figure 5A:
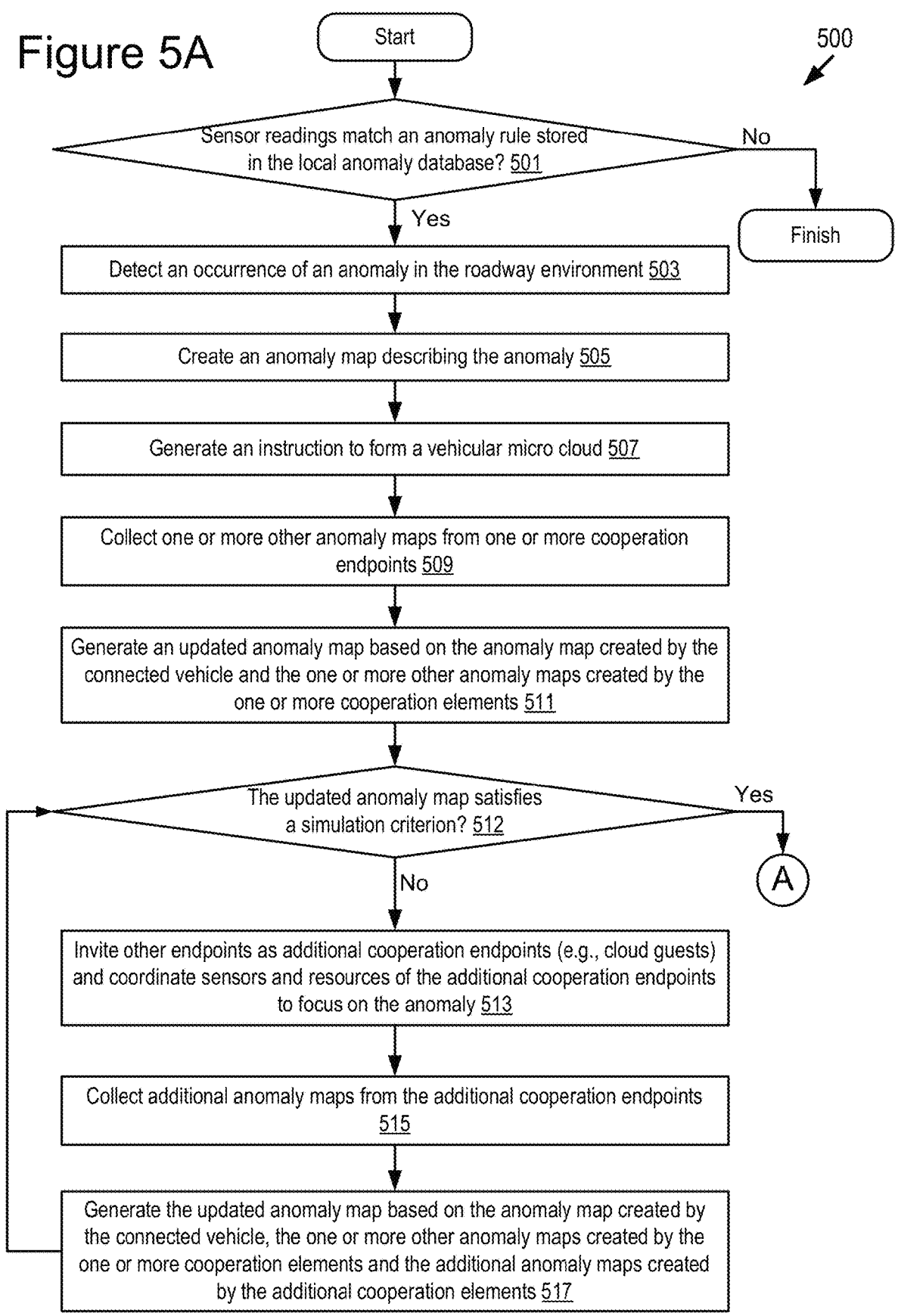
FIGS. 5A-5B depict still yet another method for generating improved anomaly maps according to some embodiments.
Figure 5B:
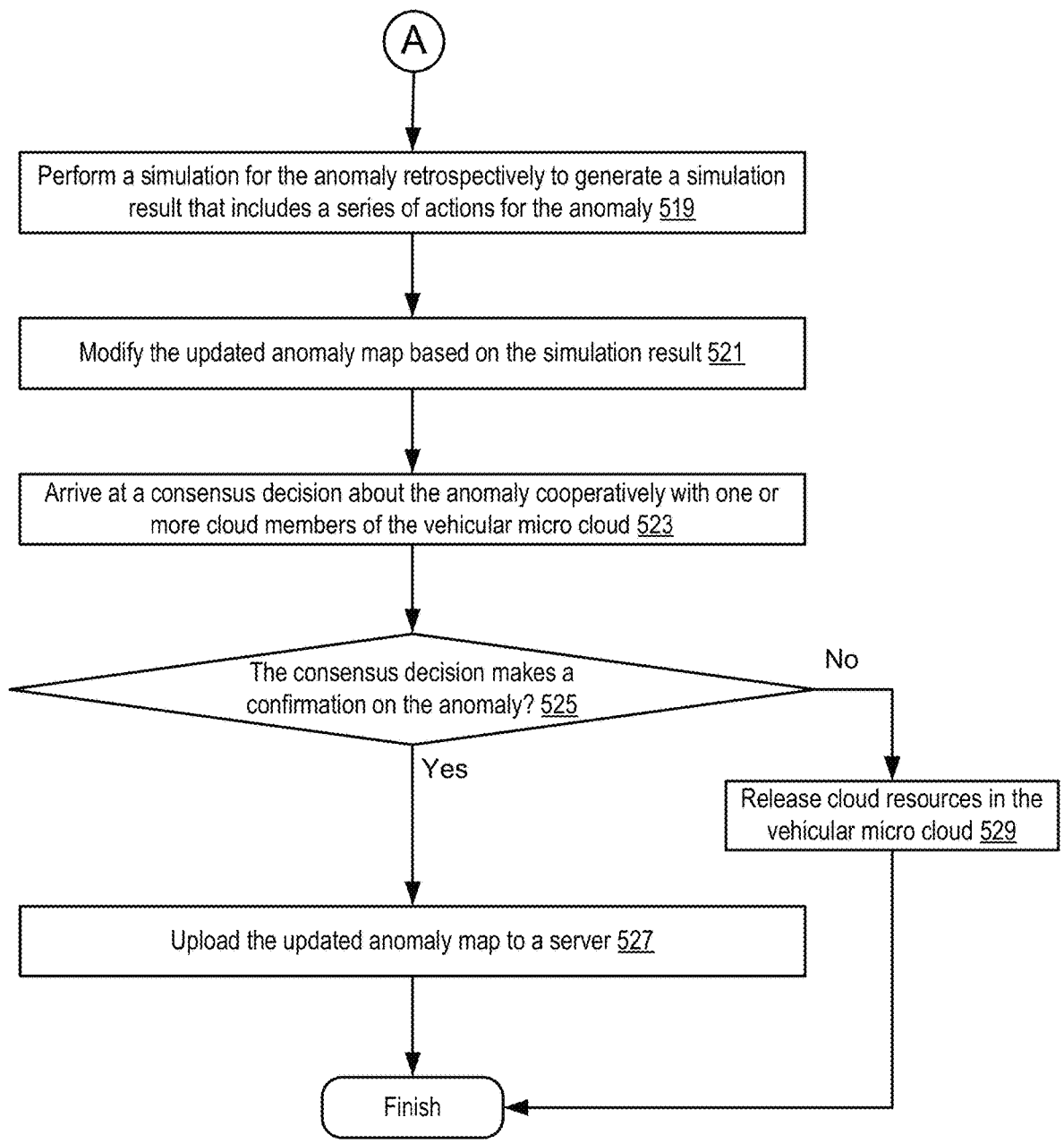

FIGS. 5A-5B depict still yet another method 500 for generating improved anomaly maps according to some embodiments. The steps of the method 500 are executable in any order, and not necessarily the order depicted in FIGS. 5A-5B. Here, assume that the method 500 is performed by a connected vehicle (e.g., the vehicle 110).

Referring to FIG. 5A, at step 501, the detection module 204 determines whether sensor readings of the connected vehicle match an anomaly rule stored in the local anomaly database 131. Responsive to the sensor readings match the anomaly rule, the method 500 moves to step 503. Otherwise, the method 500 ends.

At step 503, responsive to the sensor readings matching the anomaly rule, the detection module 204 detects an occurrence of an anomaly in the roadway environment. In some examples, this detected anomaly can be defined by the anomaly rule.

At step 505, the detection module 204 or the anomaly map manager 193 creates an anomaly map describing the anomaly.

At step 507, the anomaly map manager 193 generates an instruction to form a vehicular micro cloud so that the vehicle micro cloud is formed by either the vehicle cloud manager 197 or the anomaly client 143.

At step 509, the vehicle cloud manager 197 collects one or more other anomaly maps from one or more cooperation endpoints.

At step 511, the anomaly map manager 193 generates an updated anomaly map based on the anomaly map created by the connected vehicle and the one or more other anomaly maps created by the one or more cooperation elements.

At step 512, the anomaly map manager 193 determines whether the updated anomaly map satisfies a simulation criterion. Responsive to the updated anomaly map satisfying the simulation criterion, the method 500 moves to step 519 at FIG. 5B. Otherwise, the method 500 moves to step 513.

At step 513, the vehicle cloud manager 197 invites one or more other endpoints as one or more additional cooperation endpoints (e.g., cloud guests) and coordinates sensors and resources of the one or more additional cooperation endpoints to focus on the anomaly so that one or more additional anomaly maps are created by the one or more additional cooperation endpoints.

At step 515, the vehicle cloud manager 197 collects the one or more additional anomaly maps from the one or more additional cooperation endpoints.

At step 517, the anomaly map manager 193 generates the updated anomaly map based on: (1) the anomaly map created by the connected vehicle; (2) the one or more other anomaly maps created by the one or more cooperation elements; and (3) the one or more additional anomaly maps created by the additional cooperation elements. Then, the method 500 moves back to step 512.

Referring to FIG. 5B, at step 519, the anomaly map manager 193 performs a simulation for the anomaly retrospectively to generate a simulation result that includes a series of actions for the anomaly.

At step 521, the anomaly map manager 193 modifies the updated anomaly map based on the simulation result.

At step 523, the anomaly map manager 193 arrives at a consensus decision about the anomaly cooperatively with one or more cloud members of the vehicular micro cloud.

At step 525, the anomaly map manager 193 determines whether the consensus decision makes a confirmation on the anomaly. For example, the anomaly map manager 193 determines whether the consensus decision agrees that the anomaly is an actual anomaly rather than a false one. Responsive to the consensus decision making a confirmation on the anomaly, the method 500 moves to step 527. Otherwise, the method 500 moves to step 529.

At step 527, the anomaly map manager 193 uploads the updated anomaly map to a server (e.g., the edge server 140 or the cloud server 160).

At step 529, the vehicle cloud manager 197 releases cloud resources in the vehicular micro cloud responsive to the consensus decision making a denial on the anomaly (e.g., the anomaly being a false anomaly rather than being a real one).

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A method for a connected vehicle, comprising:
   detecting an occurrence of an anomaly in a roadway environment based on sensor data describing the roadway environment;
   creating, by the connected vehicle, an anomaly map that describes the anomaly;
   modifying an operation of a communication unit of the connected vehicle to receive one or more other anomaly maps describing the anomaly from one or more cooperation endpoints in the roadway environment, wherein the one or more cooperation endpoints are one or more of: an endpoint that is located in a region of interest associated with the anomaly; an endpoint that has been in the region of interest for a period of time that exceeds a time threshold; an endpoint that is expected to remain in the region of interest for a period of time that exceeds the time threshold; or an endpoint with a known trajectory, a known timetable or a combination thereof; and
   generating an updated anomaly map based on the anomaly map created by the connected vehicle and the one or more other anomaly maps created by the one or more cooperation endpoints so that an accuracy of the updated anomaly map is improved.

2. The method of claim 1, further comprising:
   responsive to the occurrence of the anomaly, modifying the operation of the communication unit of the connected vehicle to instruct a formation of a vehicular micro cloud; and
   modifying the operation of the communication unit to share anomaly map information in the vehicular micro cloud so that the one or more other anomaly maps are received from the one or more cooperation endpoints, wherein each of the one or more cooperation endpoints is a cloud member or a cloud guest of the vehicular micro cloud that cooperates with the connected vehicle to generate the updated anomaly map.

3. The method of claim 2, wherein responsive to the occurrence of the anomaly, modifying the operation of the communication unit of the connected vehicle to instruct the formation of the vehicular micro cloud comprises:
   generating an instruction to form the vehicular micro cloud responsive to the occurrence of the anomaly; and
   modifying one or more operation elements of the communication unit to transmit the instruction to a server, wherein the instruction causes the server to form the vehicular micro cloud that includes the connected vehicle and one or more nearby vehicles approximate to the anomaly as cloud members of the vehicular micro cloud.

4. The method of claim 2, wherein responsive to the occurrence of the anomaly, modifying the operation of the communication unit of the connected vehicle to instruct the formation of the vehicular micro cloud comprises:
   generating an instruction to form the vehicular micro cloud responsive to the occurrence of the anomaly; and
   responsive to receiving the instruction at the communication unit, modifying one or more operation elements of the communication unit to communicate with one or more nearby vehicles approximate to the anomaly so that the one or more nearby vehicles are invited by the connected vehicle to join the vehicular micro cloud.

5. The method of claim 2, wherein modifying the operation of the communication unit to share the anomaly map information in the vehicular micro cloud comprises:
modifying one or more operation elements of the communication unit to transmit the anomaly map to one or more other cloud members of the vehicular micro cloud; and
modifying the one or more operation elements of the communication unit to receive the one or more other anomaly maps from the one or more cooperation endpoints.

6. The method of claim 2, further comprising:
determining whether the updated anomaly map satisfies a simulation criterion;
responsive to the updated anomaly map satisfying the simulation criterion, performing a simulation for the anomaly to generate a simulation result based on the updated anomaly map; and
modifying the updated anomaly map based on the simulation result.

7. The method of claim 6, wherein a satisfaction of the simulation criterion by the updated anomaly map includes one or more of: a total number of anomaly maps used to generate the updated anomaly map satisfies a map threshold; a total number of views of the anomaly in the updated anomaly map satisfies a view threshold; a total number of actions of the anomaly in the updated anomaly map satisfies an action threshold; a time window of the actions of the anomaly in the updated anomaly map satisfies a time-window threshold; and a total number of remedy actions reacted against the anomaly satisfies a reaction threshold.

8. The method of claim 6, wherein the simulation result includes one or more of: a predicted future behavior of the anomaly; an impact of the anomaly on the roadway environment; a simulation of different views of surroundings around the anomaly; a simulation of one or more views of the anomaly in various perspectives; a simulation of one or more actions of the anomaly in various perspectives or in a period of time; and a simulation of one or more remedy actions against the anomaly.

9. The method of claim 6, further comprising:
modifying the operation of the communication unit to share updated anomaly map information in the vehicular micro cloud, including:
modifying one or more operation elements of the communication unit to send the updated anomaly map to one or more other cloud members of the vehicular micro cloud; and
modifying the one or more operation elements of the communication unit to receive one or more other updated anomaly maps from the one or more other cloud members of the vehicular micro cloud;
arriving at a consensus decision with the one or more other cloud members about the simulation result for the anomaly based on the updated anomaly map and the one or more other updated anomaly maps;
modifying the updated anomaly map further based on the consensus decision; and
uploading the updated anomaly map to a server using a Vehicle-to-Everything (V2X) wireless message.

10. The method of claim 6, further comprising:
responsive to the updated anomaly map not satisfying the simulation criterion:
determining one or more additional cooperation endpoints in the roadway environment, and coordinating one or more sensors, one or more computing resources or a combination thereof of each additional cooperation endpoint to focus on the anomaly so that one or more additional anomaly maps are generated by the one or more additional cooperation endpoints;
modifying the operation of the communication unit to receive the one or more additional anomaly maps from the one or more additional cooperation endpoints; and
generating the updated anomaly map further based on the one or more additional anomaly maps.

11. The method of claim 2, wherein the vehicular micro cloud is a stationary vehicular micro cloud formed at a location of the anomaly.

12. The method of claim 2, wherein the vehicular micro cloud is a mobile vehicular micro cloud formed at a current location of the anomaly or upcoming consecutive locations of the anomaly.

13. The method of claim 1, further comprising:
determining the one or more cooperation endpoints based on one or more anomaly mapping policies; and
coordinating one or more sensors, one or more computing resources or a combination thereof of each cooperation endpoint to focus on the anomaly so that the one or more other anomaly maps are generated by the one or more cooperation endpoints.

14. The method of claim 1, wherein detecting the occurrence of the anomaly in the roadway environment is based on the sensor data matching an anomaly rule.

15. The method of claim 1, wherein the anomaly includes one or more of: a human anomaly in the roadway environment; a data anomaly; a road surface anomaly; and a traffic anomaly.

16. A system of a connected vehicle, comprising:
a processor; and
a non-transitory memory storing computer code which, when executed by the processor, causes the processor to:
detect an occurrence of an anomaly in a roadway environment based on sensor data describing the roadway environment;
create, by the connected vehicle, an anomaly map that describes the anomaly;
modify an operation of a communication unit of the connected vehicle to receive one or more other anomaly maps describing the anomaly from one or more cooperation endpoints in the roadway environment, wherein the one or more cooperation endpoints are one or more of: an endpoint that is located in a region of interest associated with the anomaly; an endpoint that has been in the region of interest for a period of time that exceeds a time threshold; an endpoint that is expected to remain in the region of interest for a period of time that exceeds the time threshold; or an endpoint with a known trajectory, a known timetable or a combination thereof; and
generate an updated anomaly map based on the anomaly map created by the connected vehicle and the one or more other anomaly maps created by the one or more cooperation endpoints so that an accuracy of the updated anomaly map is improved.

17. The system of claim 16, wherein the computer code, when executed by the processor, causes the processor further to:
responsive to the occurrence of the anomaly, modify the operation of the communication unit of the connected vehicle to instruct a formation of a vehicular micro cloud; and modify the operation of the communication unit to share anomaly map information in the vehicular micro cloud so that the one or more other anomaly maps are received from the one or more cooperation endpoints, wherein each of the one or more cooperation endpoints is a cloud member or a cloud guest of the vehicular micro cloud that cooperates with the connected vehicle to generate the updated anomaly map.

18. The system of claim 16, wherein the computer code, when executed by the processor, causes the processor further to:
determine whether the updated anomaly map satisfies a simulation criterion;
responsive to the updated anomaly map satisfying the simulation criterion, perform a simulation for the anomaly to generate a simulation result based on the updated anomaly map; and
modify the updated anomaly map based on the simulation result.

19. A computer program product comprising a non-transitory memory storing computer-executable code that, when executed by a processor, causes the processor to:
detect an occurrence of an anomaly in a roadway environment based on sensor data describing the roadway environment;
create, by a connected vehicle, an anomaly map that describes the anomaly;
modify an operation of a communication unit of the connected vehicle to receive one or more other anomaly maps describing the anomaly from one or more cooperation endpoints in the roadway environment, wherein the one or more cooperation endpoints are one or more of: an endpoint that is located in a region of interest associated with the anomaly; an endpoint that has been in the region of interest for a period of time that exceeds a time threshold; an endpoint that is expected to remain in the region of interest for a period of time that exceeds the time threshold; or an endpoint with a known trajectory, a known timetable or a combination thereof; and
generate an updated anomaly map based on the anomaly map created by the connected vehicle and the one or more other anomaly maps created by the one or more cooperation endpoints so that an accuracy of the updated anomaly map is improved.

20. The computer program product of claim 19, wherein the computer-executable code, when executed by the processor, causes the processor further to:
responsive to the occurrence of the anomaly, modify the operation of the communication unit of the connected vehicle to instruct a formation of a vehicular micro cloud; and
modify the operation of the communication unit to share anomaly map information in the vehicular micro cloud so that the one or more other anomaly maps are received from the one or more cooperation endpoints, wherein each of the one or more cooperation endpoints is a cloud member or a cloud guest of the vehicular micro cloud that cooperates with the connected vehicle to generate the updated anomaly map.

* * * * *